US009666594B2

(12) United States Patent
Mizuno et al.

(10) Patent No.: US 9,666,594 B2
(45) Date of Patent: May 30, 2017

(54) MULTI-CHARGE REGION MEMORY CELLS FOR A VERTICAL NAND DEVICE

(71) Applicant: SANDISK TECHNOLOGIES, INC., Plano, TX (US)

(72) Inventors: Genta Mizuno, Yokkaichi (JP); Masanori Tsutsumi, Yokkaichi (JP); Jayavel Pachamuthu, San Jose, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 14/721,198

(22) Filed: May 26, 2015

(65) Prior Publication Data

US 2016/0071876 A1    Mar. 10, 2016

Related U.S. Application Data

(60) Provisional application No. 62/046,603, filed on Sep. 5, 2014.

(51) Int. Cl.

| H01L 27/115 | (2017.01) |
|---|---|
| H01L 27/11582 | (2017.01) |
| G11C 16/26 | (2006.01) |
| G11C 16/04 | (2006.01) |
| H01L 27/1157 | (2017.01) |

(Continued)

(52) U.S. Cl.
CPC .... H01L 27/11582 (2013.01); G11C 16/0408 (2013.01); G11C 16/0466 (2013.01); G11C 16/0483 (2013.01); G11C 16/26 (2013.01); H01L 27/1157 (2013.01); H01L 27/11565 (2013.01); H01L 27/11573 (2013.01); H01L 27/11575 (2013.01); H01L 29/7923 (2013.01)

(58) Field of Classification Search
CPC ..................... H01L 27/11551; H01L 27/11578
See application file for complete search history.

(56) References Cited

U.S. PATENT DOCUMENTS

| 5,915,167 A | 6/1999 | Leedy |
|---|---|---|
| 7,575,973 B2 | 8/2009 | Mokhlesi et al. |

(Continued)

OTHER PUBLICATIONS

U.S. Appl. No. 14/748,670, filed Jun. 24, 2015, SanDisk Technologies Inc.

(Continued)

*Primary Examiner* — Fernando L Toledo
*Assistant Examiner* — Valerie N Newton
(74) *Attorney, Agent, or Firm* — The Marbury Law Group PLLC

(57) ABSTRACT

A memory cell can be formed with a pair of charge storage regions. The pair of charge storage regions can be two portions of a charge storage region that are located at the same level and are positioned adjacent to two different control gate electrodes. Alternately, the pair of charge storage regions can be two disjoined structures located on opposite sides of a portion of a semiconductor channel. Yet alternately, the pair of charge storage regions can be two disjoined structures located at the same level, and on two laterally split semiconductor channel. The memory cell can be employed to store two bits of information within the pair of charge storage regions located at the same level within a vertical memory string that employs a single memory opening.

28 Claims, 21 Drawing Sheets

(51) Int. Cl.
  *H01L 29/792* (2006.01)
  *H01L 27/11565* (2017.01)
  *H01L 27/11573* (2017.01)
  *H01L 27/11575* (2017.01)

(56) References Cited

U.S. PATENT DOCUMENTS

| | | |
|---|---|---|
| 7,906,392 B2 | 3/2011 | Dunton et al. |
| 8,187,936 B2 | 5/2012 | Alsmeier et al. |
| 8,461,641 B2 | 6/2013 | Alsmeier et al. |
| 8,823,076 B2 | 9/2014 | Lee et al. |
| 8,853,765 B2 | 10/2014 | Lee et al. |
| 8,981,457 B2 | 3/2015 | Lee et al. |
| 8,987,119 B2 | 3/2015 | Dunton et al. |
| 9,023,719 B2 | 5/2015 | Pachamuthu |
| 2007/0029607 A1 | 2/2007 | Kouznetzov |
| 2011/0156044 A1 | 6/2011 | Lee et al. |
| 2012/0208347 A1* | 8/2012 | Hwang ............... H01L 27/1157 438/430 |
| 2015/0044833 A1 | 2/2015 | Lee et al. |
| 2015/0179660 A1 | 6/2015 | Yada et al. |

OTHER PUBLICATIONS

U.S. Appl. No. 14/721,198, filed May 26, 2015, SanDisk Technologies Inc.
U.S. Appl. No. 14/133,979, filed Dec. 19, 2013, SanDisk Technologies.
U.S. Appl. No. 14/317,274, filed Aug. 27, 2014, SanDisk Technologies.

\* cited by examiner

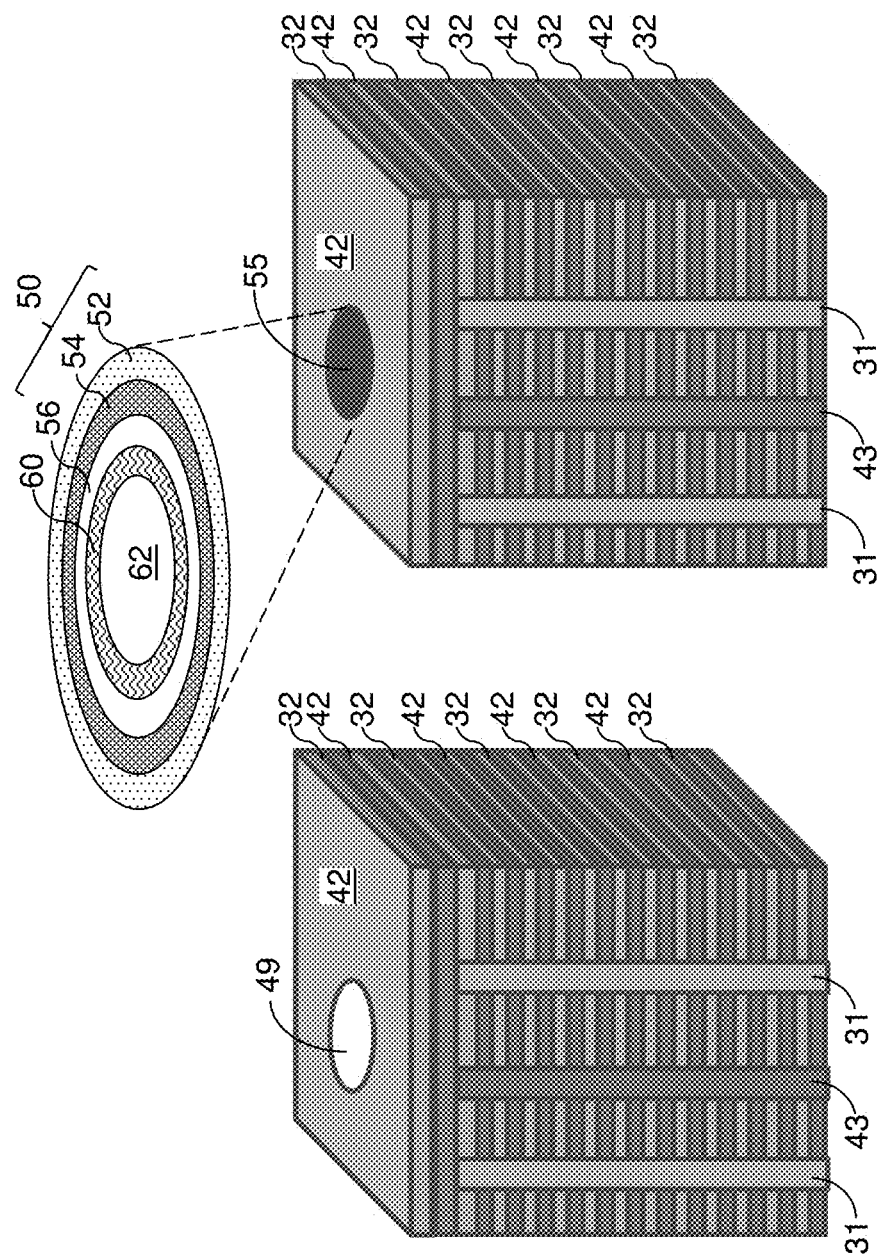

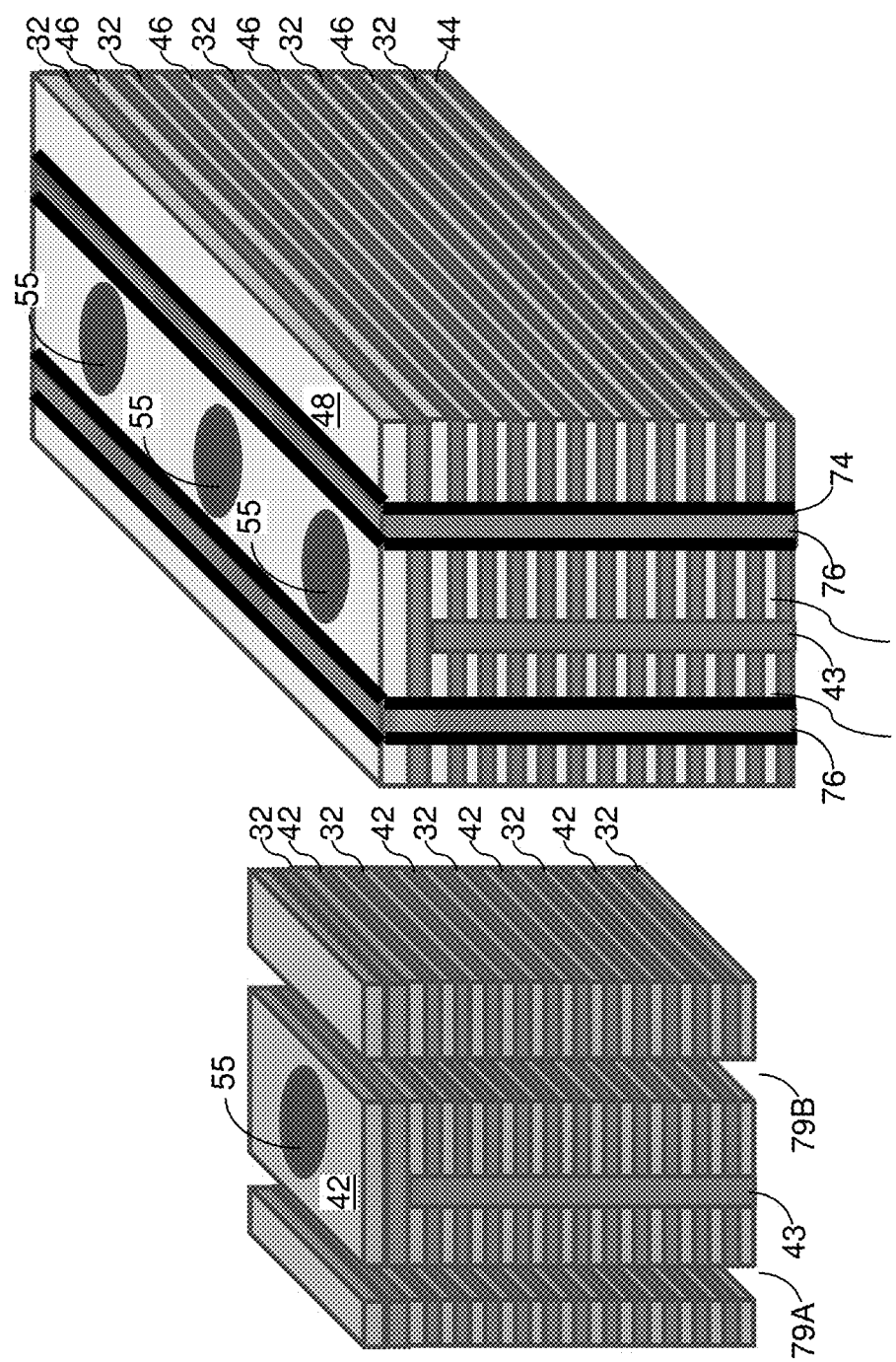

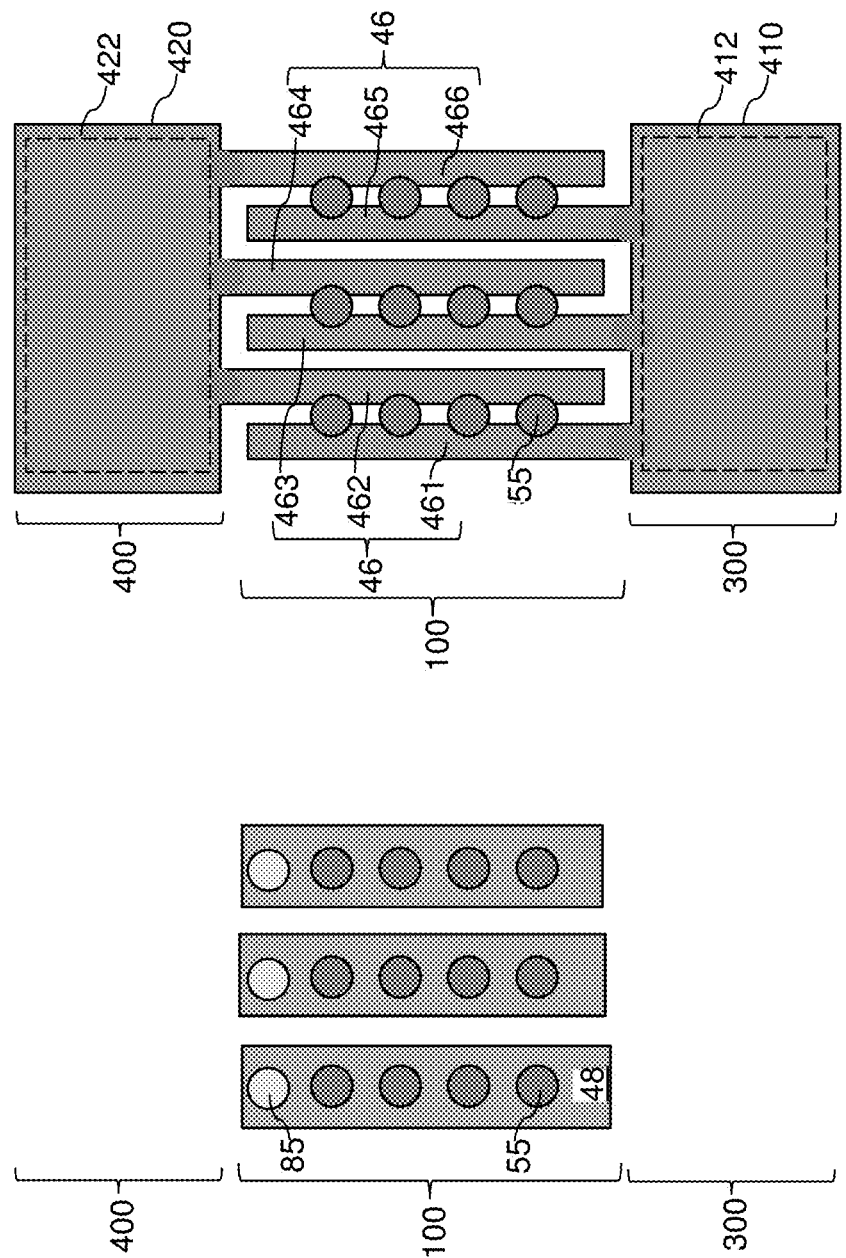

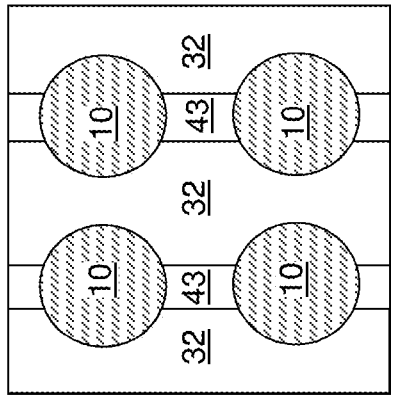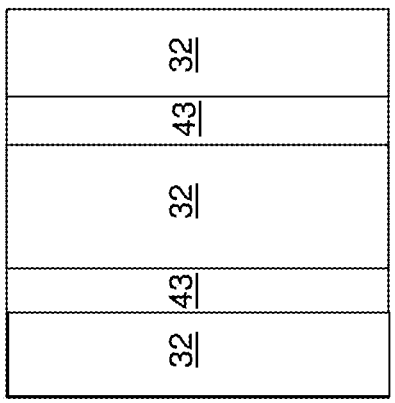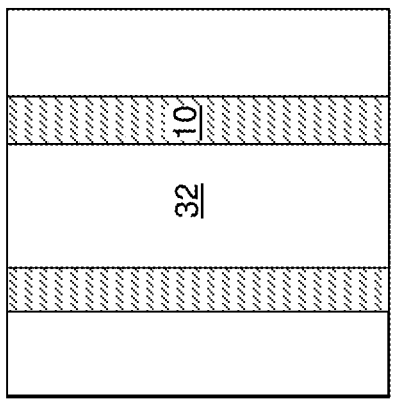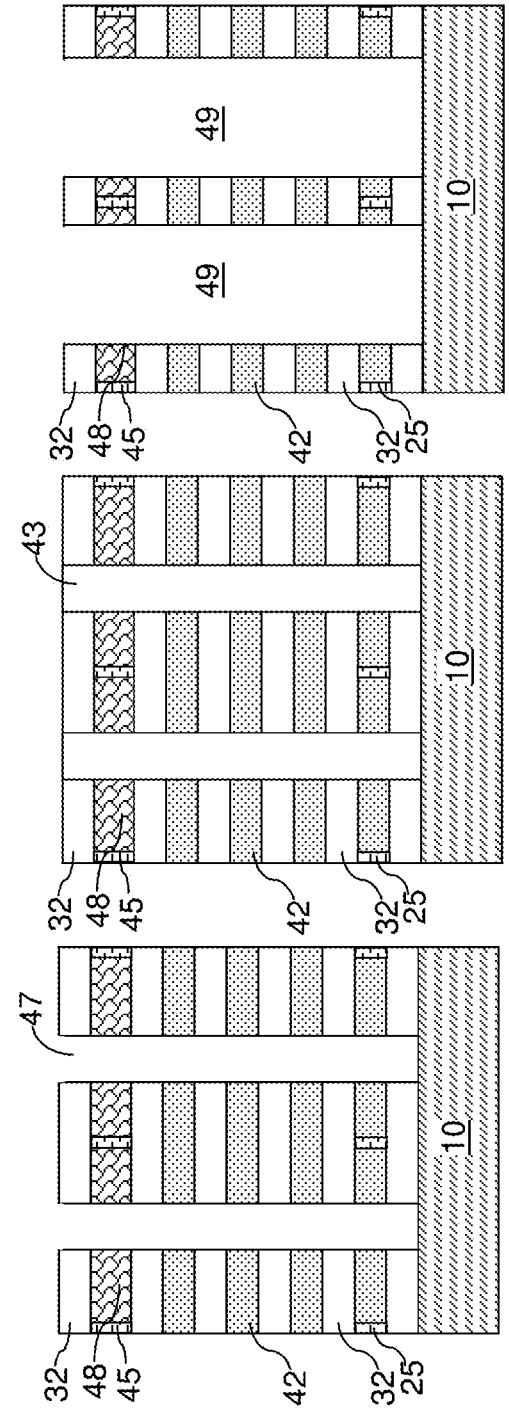

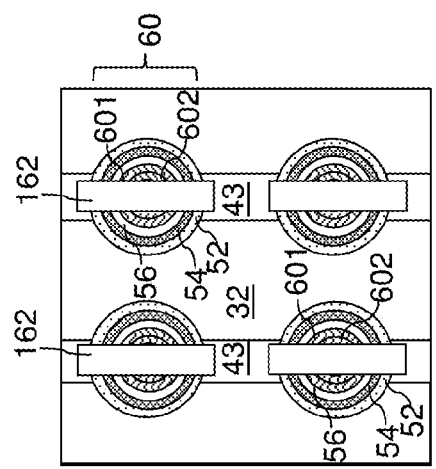
FIG. 11A
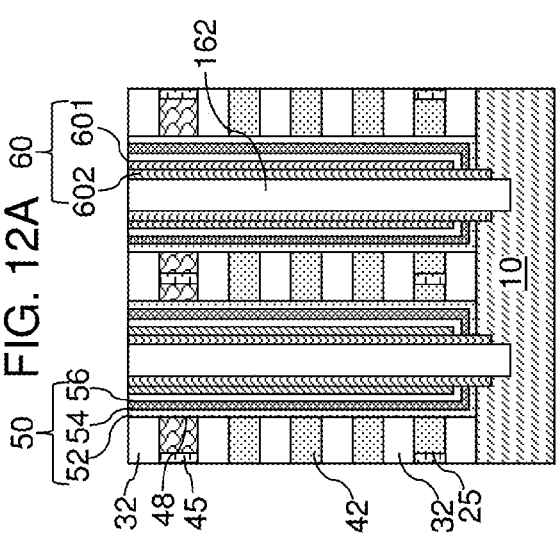
FIG. 12A
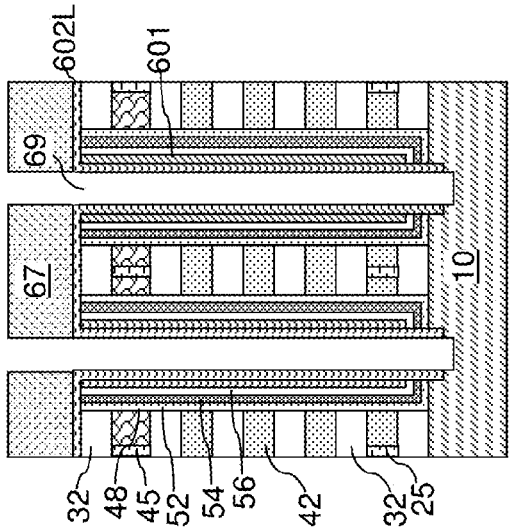
FIG. 11B
FIG. 12B

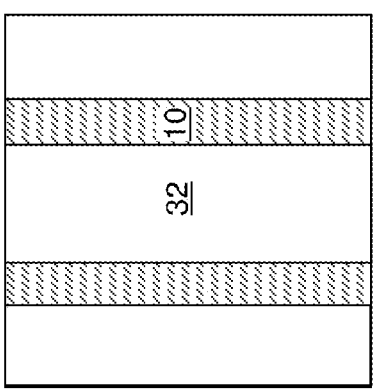
FIG. 14A
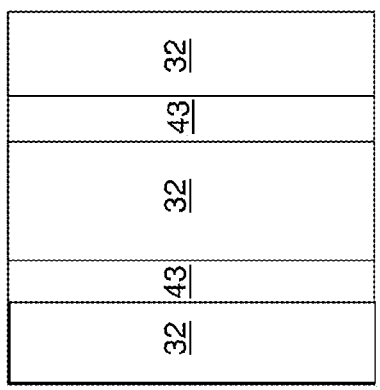
FIG. 15A
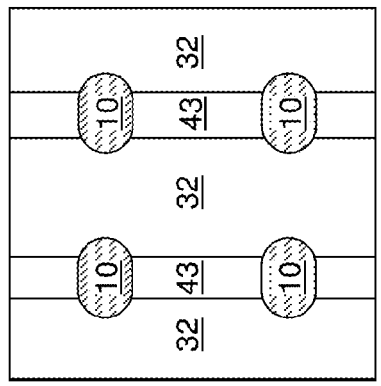
FIG. 16A
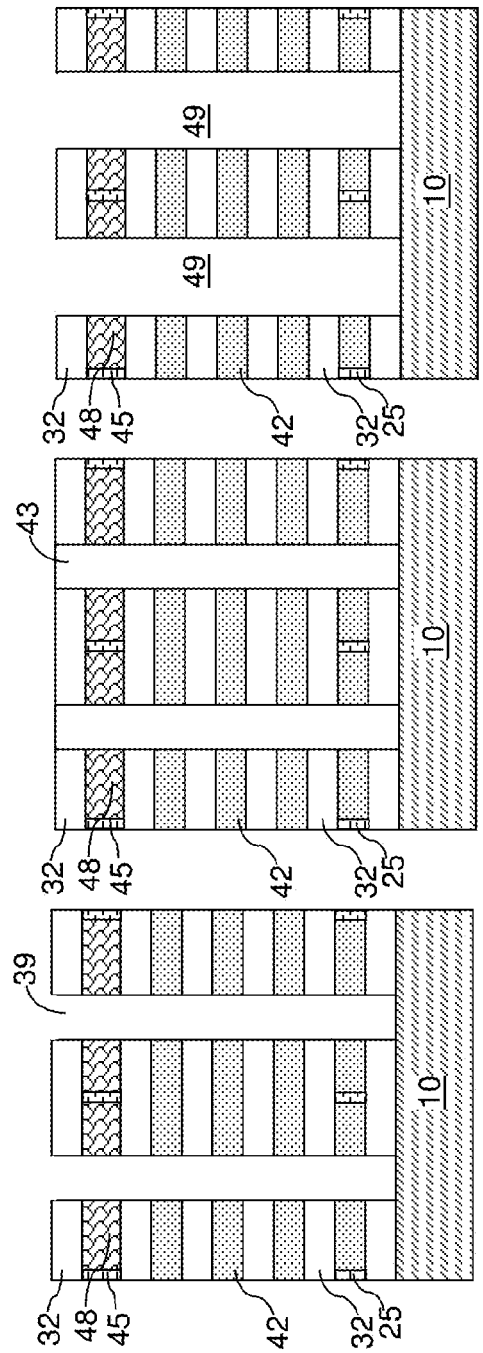
FIG. 14B
FIG. 15B
FIG. 16B

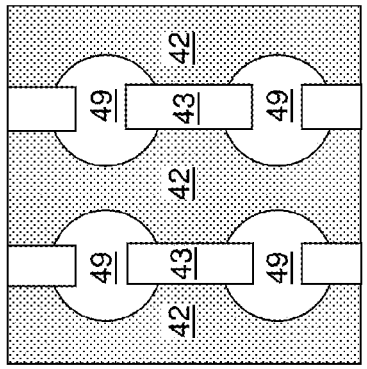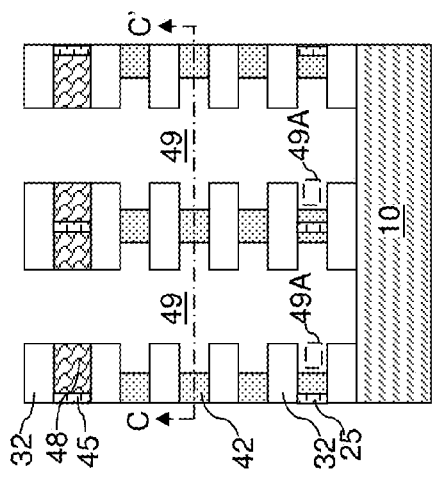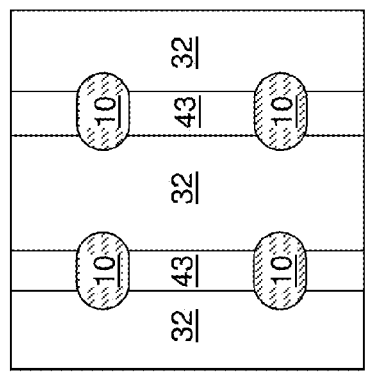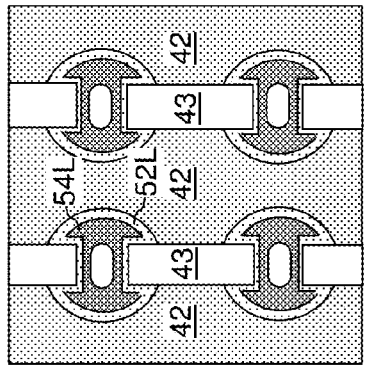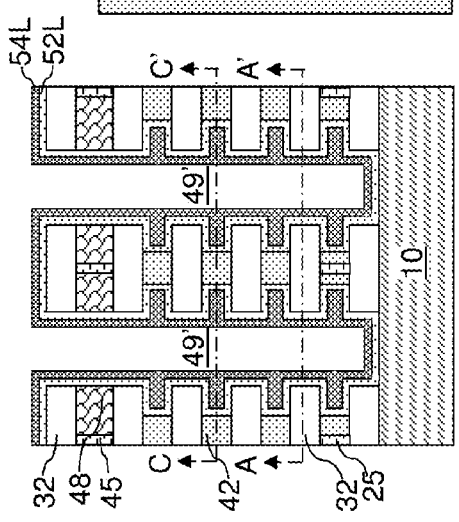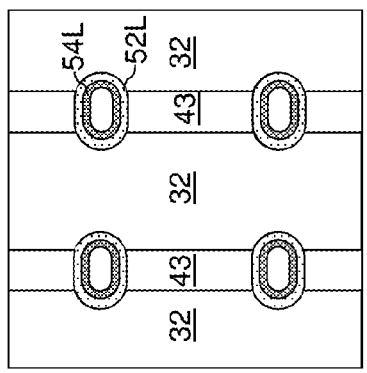

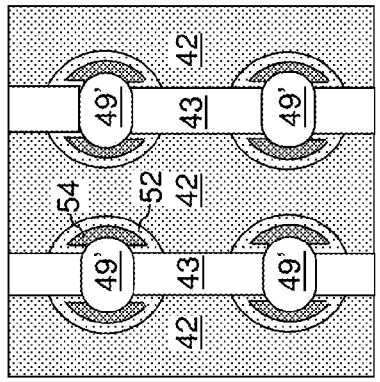
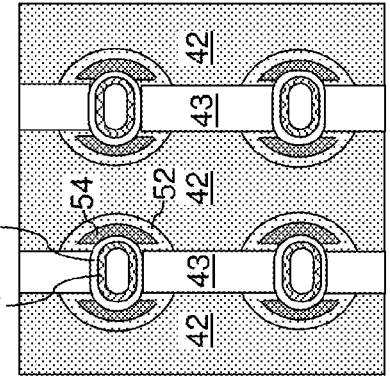
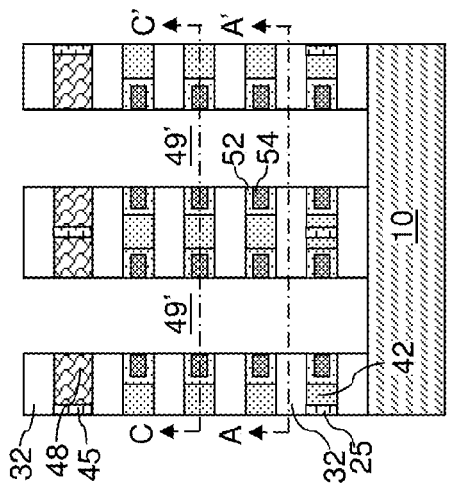
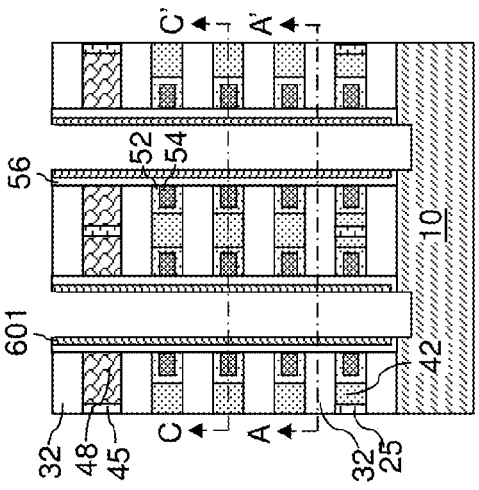
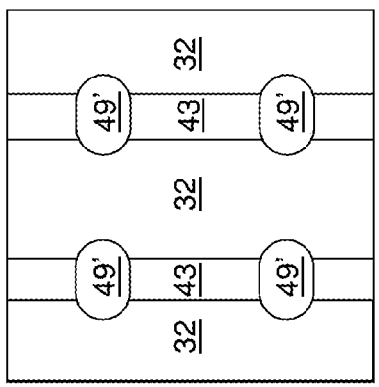
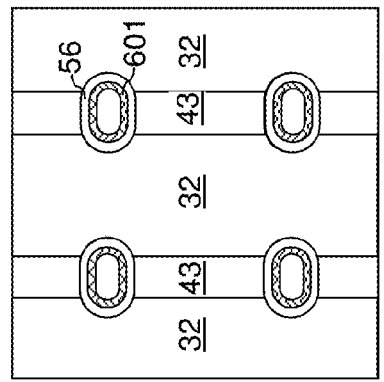

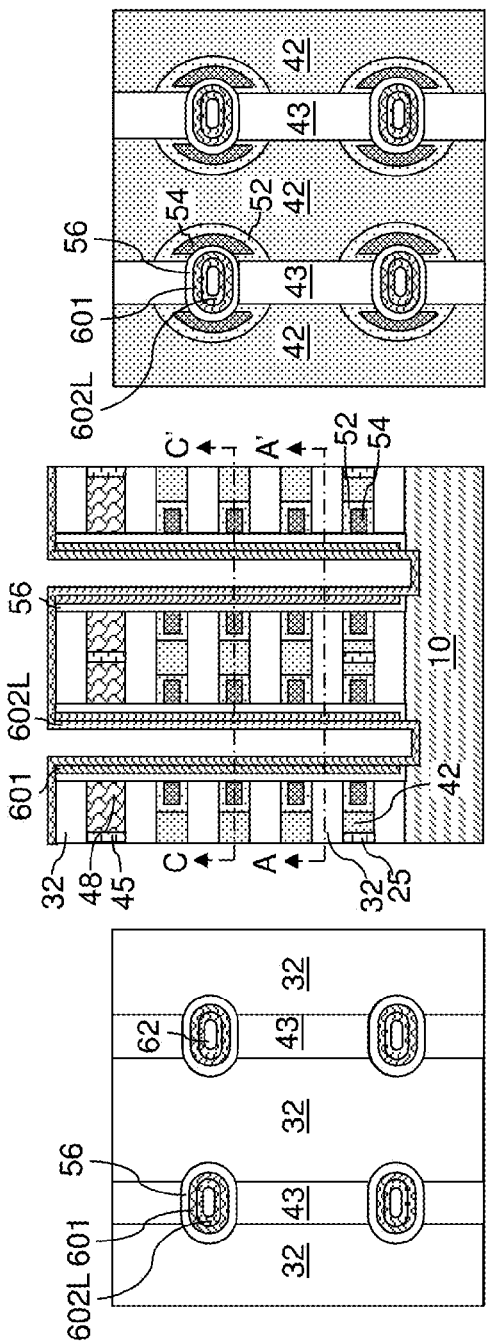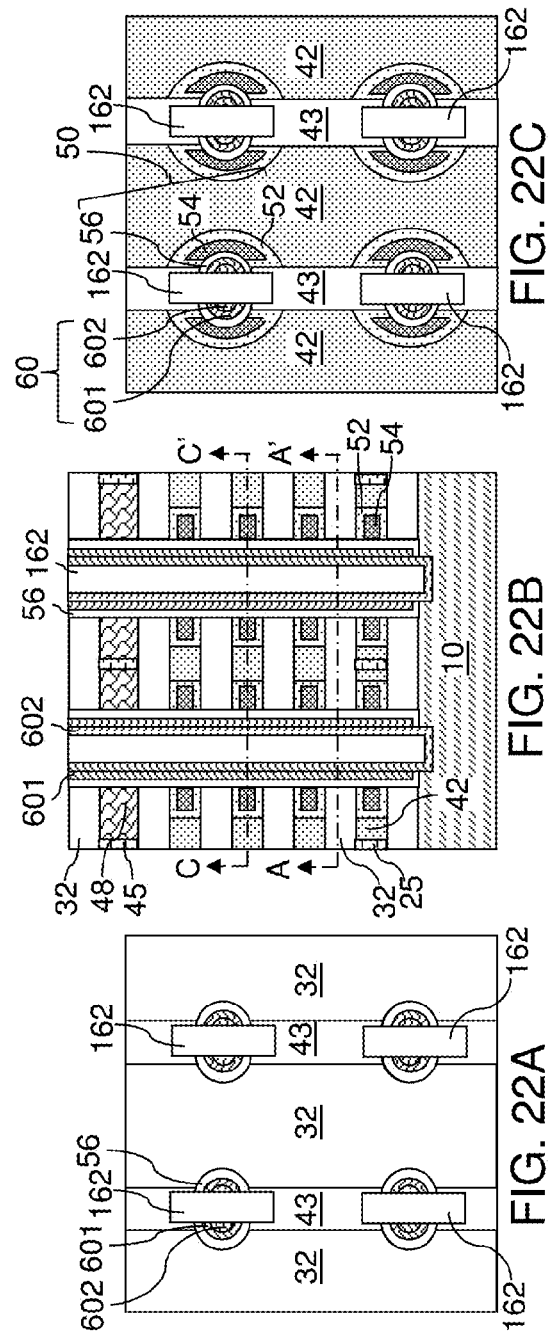

US 9,666,594 B2

MULTI-CHARGE REGION MEMORY CELLS FOR A VERTICAL NAND DEVICE

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as a Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

SUMMARY

According to an aspect of the present disclosure, a memory device comprises a substrate having a major surface, and a first plurality of memory cells arranged in a first string extending in a first direction substantially perpendicular to the major surface of the substrate in a plurality of device levels. Each of the first plurality of memory cells is positioned in a respective one of the plurality of device levels above the substrate. A first select gate electrode is located between the major surface of the substrate and the first plurality of memory cells. A second select gate electrode is located above the first plurality of memory cells. Each memory cell in the first string further comprises a portion of a first control gate electrode extending in a second direction substantially parallel to the major surface, and a portion of a second control gate electrode extending in the second direction, located at a same level as the respective first control gate electrode, and spaced apart from the respective first control gate electrode in a third direction substantially parallel to the major surface and transverse to the second direction. For each memory cell in the first string, the respective first control gate electrode is electrically insulated from the respective second control gate electrode.

According to another aspect of the present disclosure, a method of reading a memory cell of a NAND memory device is provided. A first NAND string comprising a plurality of memory cells is provided. Each memory cell in the first NAND string comprises a portion of a first control gate electrode located adjacent to a first portion of a memory film and a portion of a second control gate electrode which is located adjacent to a second portion of the memory film. The second control gate electrode is electrically insulated from the first control gate electrode. A select read voltage of a first polarity type is applied to the first control gate electrode. An unselect read voltage of a second polarity type opposite to the first polarity type is applied to the second control gate electrode during the step of applying the select read voltage to the first control gate electrode.

According to yet another aspect of the present disclosure, a method of making a memory device is provided. A stack of alternating layers of a first material and a second material different from the first material is formed over a substrate. A trench is formed through the stack. The trench is filled with a separator insulating material. A memory opening is formed in the stack. The memory opening extends through the separator insulating material located in the trench. At least a portion of a memory film is formed in the memory opening. A semiconductor channel is formed in the memory opening over the at least the portion of the memory film.

BRIEF DESCRIPTION OF THE DRAWINGS

FIGS. 2A-2J are sequential bird's eye views of a cut-out portion of a first exemplary device structure during sequential manufacturing steps according to a first embodiment of the present disclosure.

FIG. 3B-3D are schematic horizontal cross-sectional views of the array region of the first exemplary device structure according to the first embodiment of the present disclosure.

FIG. 6A is a top-down view of an array region of a second exemplary device structure after formation of laterally-extending trenches according to the second embodiment of the present disclosure.

FIG. 6B is a vertical cross-sectional view of the second exemplary device structure of FIG. 6A.

FIG. 7A is a top-down view of the array region of the second exemplary device structure after formation of separator insulator structures according to a second embodiment of the present disclosure.

FIG. 7B is a vertical cross-sectional view of the second exemplary device structure of FIG. 7A.

FIG. 8A is a top-down view of the array region of the second exemplary device structure after formation of memory openings according to the second embodiment of the present disclosure.

FIG. 8B is a vertical cross-sectional view of the second exemplary device structure of FIG. 8A.

FIG. 11A is a top-down view of the array region of the second exemplary device structure after formation of channel-splitting trenches according to the second embodiment of the present disclosure.

FIG. 11B is a vertical cross-sectional view of the second exemplary device structure of FIG. 11A.

FIG. 12A is a top-down view of the array region of the second exemplary device structure after formation of channel-splitting dielectric structures according to the second embodiment of the present disclosure.

FIG. 12B is a vertical cross-sectional view of the second exemplary device structure of FIG. 12A.

FIG. 14A is a top-down view of a third exemplary device structure after formation of laterally-extending trenches according to a third embodiment of the present disclosure.

FIG. 14B is a vertical cross-sectional view of the third exemplary device structure of FIG. 14A.

FIG. 15A is a top-down view of the third exemplary device structure after formation of separator insulator structures according to a third embodiment of the present disclosure.

FIG. 15B is a vertical cross-sectional view of the third exemplary device structure of FIG. 15A.

FIG. 16A is a top-down view of the third exemplary device structure after formation of memory openings according to the third embodiment of the present disclosure.

FIG. 16B is a vertical cross-sectional view of the third exemplary device structure of FIG. 16A.

FIG. 17A is a top-down view of the third exemplary device structure after selective lateral expansion of the memory openings according to the third embodiment of the present disclosure.

FIG. 17B is a vertical cross-sectional view of the third exemplary device structure of FIG. 17A.

FIG. 17C is a horizontal cross-sectional view of the third exemplary device structure along the horizontal plane C-C' of FIG. 17B.

FIG. 18A is a horizontal cross-sectional view of the third exemplary device structure after formation of a blocking dielectric layer and a charge storage material layer along the horizontal plane A-A' of FIG. 18B according to the third embodiment of the present disclosure.

FIG. 18B is a vertical cross-sectional view of the third exemplary device structure of FIG. 18A.

FIG. 18C is a horizontal cross-sectional view of the third exemplary device structure along the horizontal plane C-C' of FIG. 18B.

FIG. 19A is a top-down view of the third exemplary device structure after formation of blocking dielectrics and charge storage material portions along the horizontal plane A-A' of FIG. 19B according to the third embodiment of the present disclosure.

FIG. 19B is a vertical cross-sectional view of the third exemplary device structure of FIG. 19A.

FIG. 19C is a horizontal cross-sectional view of the third exemplary device structure along the horizontal plane C-C' of FIG. 19B.

FIG. 20A is a top-down view of the array region of the third exemplary device structure after formation of tunnel dielectrics and first semiconductor channels along the horizontal plane A-A' of FIG. 20B according to the third embodiment of the present disclosure.

FIG. 20B is a vertical cross-sectional view of the third exemplary device structure of FIG. 20A.

FIG. 20C is a horizontal cross-sectional view of the third exemplary device structure along the horizontal plane C-C' of FIG. 20B.

FIG. 21A is a top-down view of the array region of the third exemplary device structure after formation of a second semiconductor channel along the horizontal plane A-A' of FIG. 21B according to the third embodiment of the present disclosure.

FIG. 21B is a vertical cross-sectional view of the third exemplary device structure of FIG. 21A.

FIG. 21C is a horizontal cross-sectional view of the third exemplary device structure along the horizontal plane C-C' of FIG. 21B.

FIG. 22A is a top-down view of the array region of the third exemplary device structure after formation of channel-splitting dielectric structures along the horizontal plane A-A' of FIG. 22B according to the third embodiment of the present disclosure.

FIG. 22B is a vertical cross-sectional view of the third exemplary device structure of FIG. 22A.

FIG. 22C is a horizontal cross-sectional view of the third exemplary device structure along the horizontal plane C-C' of FIG. 22B.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1:
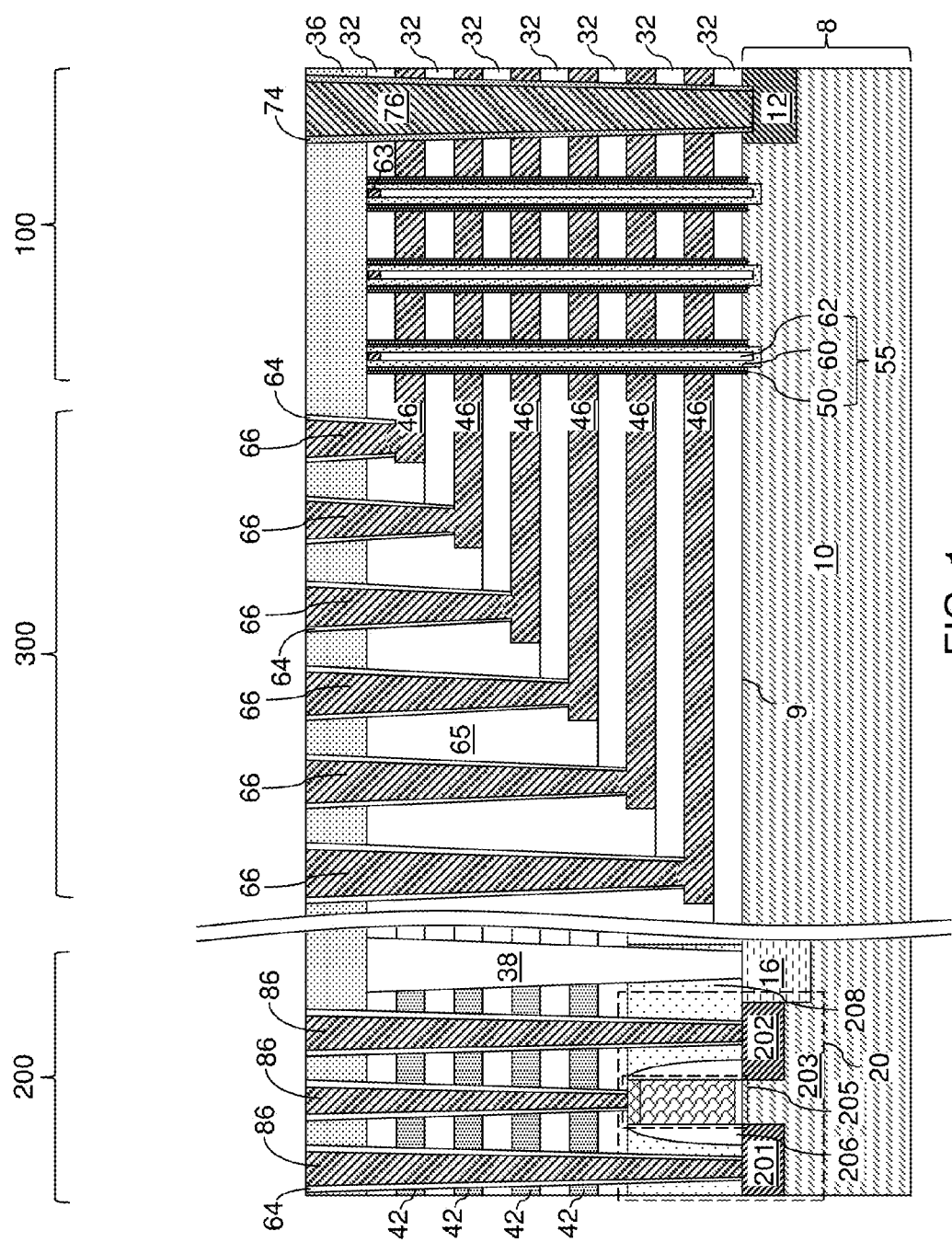
FIG. 1 is a vertical cross-section of an exemplary device structure containing a 3D NAND stacked memory device according to embodiments of the present disclosure.

Referring to FIG. 1, an exemplary device structure according to embodiments of the present disclosure is shown, which includes a 3D NAND stacked memory device. The exemplary device structure can be employed to incorporate any of the various embodiments for forming memory stack structures 55 according to the present disclosure. Each memory stack structure 55 can include at least a memory film 50, a semiconductor channel 60, and optionally a dielectric core 62 in case the semiconductor channel 60 does not fill the entire volume within the memory film 50.

The exemplary device structure includes a substrate 8, which can be a semiconductor substrate. Various semiconductor devices can be formed on, or over, the substrate 8 employing methods known in the art. For example, an array of memory devices can be formed in a device region 100, and at least one peripheral device 20 can be formed in a peripheral device region 200. Electrically conductive via contacts to the electrically conductive electrodes of the devices in the device region 100 can be formed in a contact region 300.

The substrate 8 can include a substrate semiconductor layer 10. The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface.

As used herein, a "semiconductor material" refers to a material having electrical conductivity in the range from $1.0 \times 10^{-5}$ Ohm-cm to $1.0 \times 10^5$ Ohm-cm, and is capable of producing a doped material having electrical conductivity in a range from 1 Ohm-cm to $1.0 \times 10^5$ Ohm-cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than 1.0 Ohm-cm. As used herein, an "insulator material" or a "dielectric material" refers to a material having electrical conductivity less than $1.0 \times 10^{-5}$ Ohm-cm. All measurements for electrical conductivities are made at the standard condition.

Optionally, select gate electrodes (not shown) can be formed within, or on top of, the substrate semiconductor layer 10 using any suitable methods for implementing the array of vertical NAND strings. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference. A source region 12 can be formed in a region of the substrate semiconductor layer 10 that is laterally offset from the memory stack structures 55. Alternatively, a source region can be formed directly underneath memory stack structures 55 of memory cells, as described in U.S. patent application Ser. No. 14/317,274, filed on Jun. 27, 2014, which is incorporated herein by reference. A select transistor can be formed between the top of the substrate semiconductor layer 10 and the bottommost control gate of the memory devices.

At least one optional shallow trench isolation structure 16 and/or at least one deep trench isolation structure (not shown) may be employed to provide electrical isolation among various semiconductor devices on the substrate 8. The at least one peripheral device 20 formed in the peripheral device region 200 can include any device known in the art and needed to support the operation of the semiconductor devices in the device region 100. The at least one peripheral device 20 can include a driver circuit associated with the array of the memory devices in the device region 100. The at least one peripheral device can comprise transistor devices in the driver circuit. In one embodiment, the at least one peripheral device can include one or more field effect transistors, each of which can include a source region 201, a drain region 202, a body region 203 (e.g., a channel region), a gate stack 205, and a gate spacer 206. The gate stack 205 can include any type of gate stack known in the art. For example, each gate stack 205 can include, from one side to another, a gate dielectric, a gate electrode, and an optional gate cap dielectric. Optionally, a planarization dielectric layer 208 including a dielectric material may be employed in the peripheral device region 200 to facilitate planarization of the portion of material stacks to be subsequently formed on the substrate 8.

A stack of alternating layers of a first material and a second material different from the first material is formed over a top surface of the substrate 8. In one embodiment, the first material can be an insulator material that forms insulator layers 32, and the second material can be a conductive material that forms conductive line structures that can include control gate electrodes 46, source-side select gate electrodes (not separately shown), and drain-side select gate electrodes (not separately shown). Alternatively, the first material can be an insulator material that forms insulator layers 32, and the second material can be a sacrificial material that is deposited as sacrificial layers, and is at least partly replaced with a conductive material to form various conductive line structures after formation of memory stack structures 55.

The memory stack structures 55 can be formed through the alternating stack (32, 46) of the insulator layers 32 and the control gate electrodes 46 employing the various methods of the present disclosure to be described below. A drain region 63 can be formed on top of each semiconductor channel 60. The control gate electrodes 46 can form terraced (stepped) structures within the contact region 300 in order to facilitate formation of contact via structures 66. A contact region dielectric fill portion 65 may be optionally employed over the terraced structures of the control gate electrodes 66. A dielectric liner 64 may be optionally formed around each contact via structure 66 to enhance electrical isolation of the contact via structures 66. A hard mask layer 36 may be optionally employed to facilitate formation of the contact via structures 66. Peripheral contact via structures 86 can be formed in the peripheral device region 200. A source line 76 can be formed through the alternating stack (32, 46) to provide electrical contact to the source region 12. A dielectric spacer 74 can be employed to provide electrical isolation for the source line 76. Subsequently, contacts (not shown) to the drain regions 63 can be formed, and bit lines (not shown) that overlie, and electrically shorted to, the drain regions 63 can be formed.

Figure 2A:
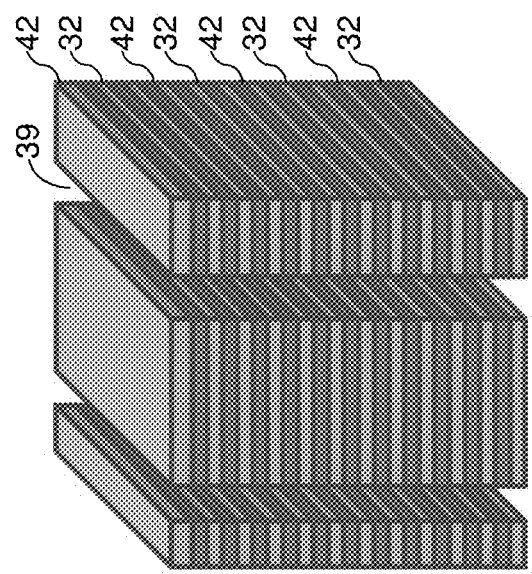

Referring to FIG. 2A, a cut-out portion of a first exemplary device structure according to a first embodiment of the present disclosure is illustrated at a processing step after formation of an alternating stack (32, 42). The alternating stack (32, 42) includes alternating layers of a first material and a second material different from the first material. In one embodiment, the alternating stack (32, 42) can include insulator layers 32 composed of the first material, and sacrificial material layers 42 composed of a second material different from that of insulator layers 32. The sacrificial material layers may comprise electrically conductive material which forms the control gate electrodes of the NAND string. Alternatively, the sacrificial material layers 42 may comprise electrically insulating or conductive sacrificial layers which are removed through the back side openings and replaced with metal control gate electrodes. The insulator layers 32 can comprise insulator layers that provide the functionality of electrical insulation, and the sacrificial material layers 42 can comprise sacrificial layers that are subsequently removed.

The first material can be at least one electrically insulating material. As such, each insulator layer 32 can be an insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials.

The sacrificial material layers 42 can function as control gate electrodes made of at least one conductive material. In this case, each sacrificial material layer 42 can be a conductive material layer. Conductive materials that can be employed for the sacrificial material layers 42 that constitute the control gate electrodes include, but are not limited to, a doped semiconductor material, elemental metals, intermetallic alloys, conductive nitrides of at least one elemental metal, a silicate of at least one metal, conductive carbon allotropes, organic conductive materials, and combinations thereof. For example, the second material can be doped polysilicon, tungsten, tungsten nitride, tantalum, tantalum nitride, titanium, titanium nitride, cobalt, copper, aluminum, an alloy thereof, or a combination thereof. Alternatively, the sacrificial material layers 42 may comprise sacrificial layers, such as silicon nitride or polysilicon sacrificial layers. In this case, at least one, and/or each, of the sacrificial material layers 42 can be a sacrificial material layer. In an illustrative example, the sacrificial material layers 42 can be silicon nitride layers that can be subsequently removed, for example, by a wet etch employing phosphoric acid.

In one embodiment, the insulator layers 32 can include silicon oxide, and sacrificial material layers can include silicon nitride sacrificial layers or doped polysilicon or doped amorphous silicon layers that can be subsequently converted into doped polysilicon through a thermal anneal at an elevated temperature. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, by physical vapor deposition (PVD; sputtering), chemical vapor deposition, electroplating, electroless plating, or combinations thereof.

The sacrificial material layers 42 can be suitably patterned to function as the control gate electrodes of the monolithic three-dimensional NAND string memory devices to be subsequently formed. Each sacrificial material layer 42 may comprise a portion having a strip shape extending substantially parallel to the major surface 9 of the substrate 8.

The thicknesses of the insulator layers 32 and the sacrificial material layers 42 can be in a range from 8 nm to 128 nm, although lesser and greater thicknesses can be employed for each insulator layer 32 and for each control gate electrode 42. In one embodiment, the thicknesses of the insulator layers 32 and the sacrificial material layers 42 can be in a range from 20 nm to 50 nm. The number of repetitions of the pairs of a insulator layer 32 and a sacrificial material layer (e.g., control gate electrode or sacrificial material) 42 can be in a range from 2 to 1,024, and typically from 8 to 256, although a greater number of repetitions can also be employed. The top and bottom gate electrodes in the stack may function as the select gate electrodes.

Figure 2B:
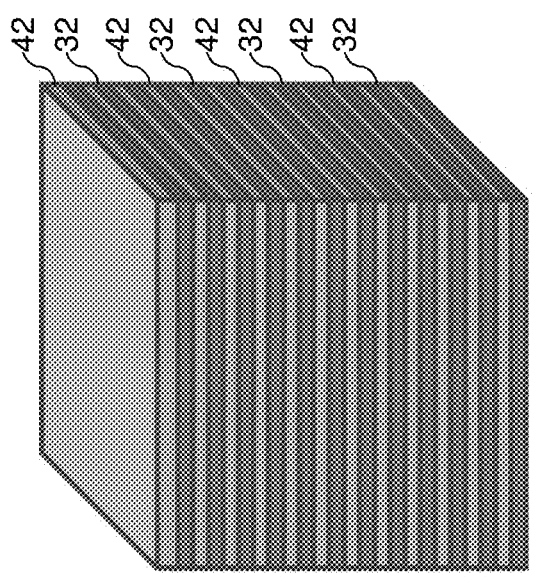

Referring to FIG. 2B, laterally-extending trenches 39 can be formed through the alternating stack (32, 42). As used herein, a laterally-extending trench refers to a trench that includes a portion having a greater lateral extent along a lengthwise direction than along a widthwise direction. A laterally-extending trench may be a linear or curved, and may include multiple portions having different lengthwise directions, and may have the same width or undulating widths. The laterally-extending trenches 39 can be formed, for example, by application and patterning of a photoresist layer over the alternating stack (32, 42), and transfer of the pattern in the patterned photoresist layer through the alternating stack (32, 42) to the top surface of the substrate 8 (not shown; See FIG. 1) that is located at the bottom of the alternating stack (32, 42). The laterally-extending trenches 39 laterally extend along a horizontal direction. In one embodiment, the laterally-extending trenches 39 can have a substantially uniform width, and can be parallel among one another. The laterally-extending trenches 39 can laterally divide the alternating stack (32, 42) into a plurality of portions.

Figure 2C:
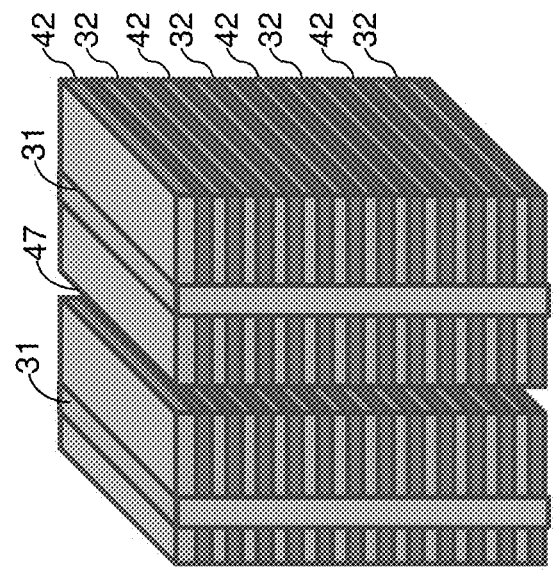

Referring to FIG. 2C, each laterally-extending trench 39 can be filled with another sacrificial material, which can be the same as, or different from, the second material. For example, the second material can be silicon nitride or polysilicon, and the sacrificial material deposited in the laterally-extending trenches 39 can be silicon nitride. Excess portions of the dielectric material can be removed from above the top surface of the alternating stack, for example, by chemical mechanical planarization (CMP), a recess etch, or a combination thereof. Remaining portions of the deposited dielectric material constitutes inter-electrode fill structures 31. In one embodiment, the inter-electrode fill structures 31 can laterally separate various portions of the alternating stack (32, 42).

Figure 2D:
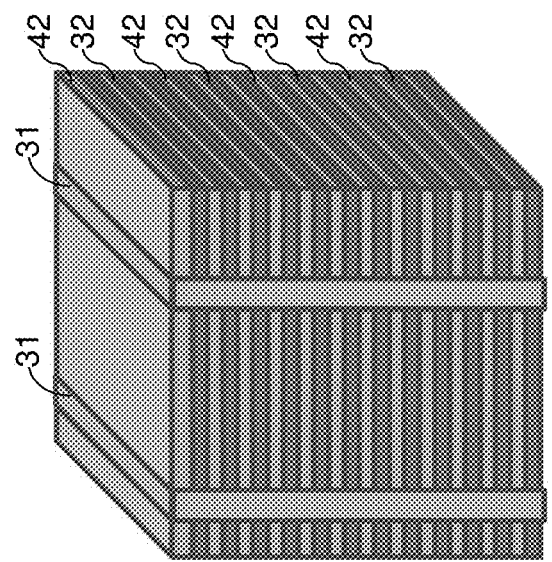

Referring to FIG. 2D, a separator trench 47 can be formed between a neighboring pair of inter-electrode fill structures 31. In one embodiment, a separator trench 47 can include sidewalls that are parallel to the sidewalls of the neighboring pair of inter-electrode fill structures 31. In one embodiment, each separator trench 47 can have a uniform width throughout. Each separator trench 47 can vertically extend from the top surface of the alternating stack (32, 42) to the top surface of the substrate 8 (not shown; See FIG. 1) that is located at the bottom of the alternating stack (32, 42).

Figure 2F:
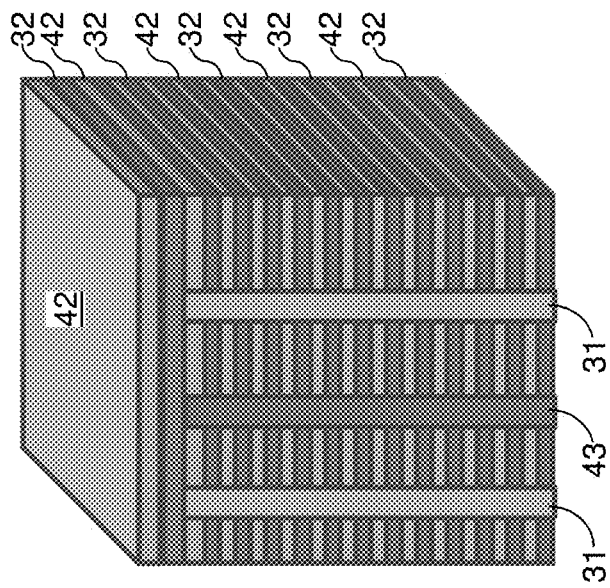
Figure 2E:
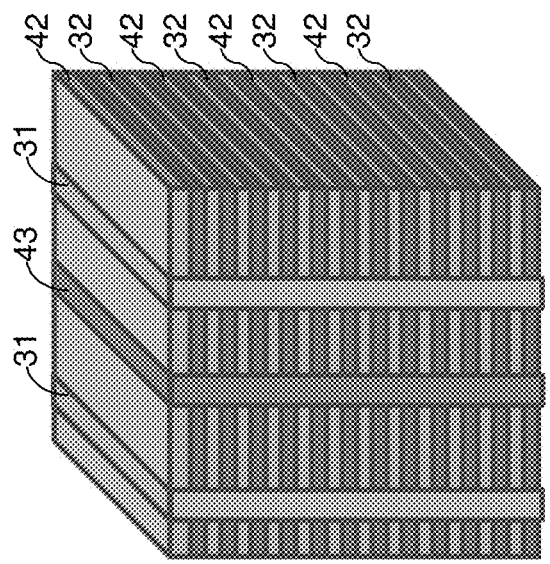

Referring to FIG. 2E, each separator trench 47 can be filled with a dielectric material that is different from the second material. The dielectric material that fills the separator trenches 47 is herein referred to as a separator insulating material. For example, the separator insulating material can be silicon oxide. Excess portions of the separator insulating material can be removed from above the top surface of the alternating stack, for example, by chemical mechanical planarization (CMP), a recess etch, or a combination thereof. Remaining portions of the deposited separator insulating material constitutes separator insulator structures 43. In one embodiment, the separator insulator structures 43 can laterally separate various portions of the alternating stack (32, 42).

Referring to FIG. 2F, another sacrificial material layer 42 and another insulator layer 32 can be sequentially deposited over the alternating stack (32, 42) to increase the total number of layers within the alternating stack (32, 42). The deposited sacrificial material layer 42 is a select gate sacrificial layer, which is subsequently replaced with select gate electrodes. The select gate sacrificial layer is deposited over an underlying insulator layer 32, which is a separating insulator layer that subsequently separates select gate electrodes from underlying control gate electrodes. The deposited insulator layer 32 is herein referred to as an insulating cover layer.

Referring to FIG. 2G, a memory opening 49 can be formed through the alternating stack (32, 42) by application of a photoresist layer over the alternating stack (32, 42), lithographic patterning of the photoresist layer, and transfer of the pattern in the photoresist layer through the alternating stack (32, 42) by an anisotropic etch such as a reactive ion etch. The photoresist layer can be subsequently removed, for example, by ashing. Each memory opening 49 extends through the insulating cover layer, i.e., the topmost insulator layer 32, and through the select gate sacrificial layer, i.e., the topmost sacrificial material layer 42, and the underlying alternating stack (32, 42) of insulator layers 32 and sacrificial material layers 42. Each memory opening 49 can vertically extend from the top surface of the alternating stack (32, 42) to the top surface of the substrate 8 (not shown; See FIG. 1) that is located at the bottom of the alternating stack (32, 42). Each memory opening 49 can be located between a pair of inter-electrode fill structures 31 and through a portion of a separator insulator structure 43. In other words, a memory opening 49 can divide a separator insulator structure 43 into two physically disjoined portions. Each memory opening 49 in the alternating stack (32, 42) can extend through the separator insulating material located in the separator trench 47, i.e., through the remaining portions of the separator insulator structure 43.

Referring to FIG. 2H, a memory stack structure 55 can be formed in each memory opening 49. The memory stack structure 55 can include at least a portion of a memory film 50, a semiconductor channel 60, and optionally a dielectric core 62. Each memory film 50 can include, from outside to inside, a blocking dielectric 52, a charge storage region 54, and a tunnel dielectric 56. At least a portion of each memory film 50 is formed in a memory opening 49 (See FIG. 2G). Each semiconductor channel 60 is formed in a memory opening 49 and over the at least the portion of the memory film 50.

Each blocking dielectric 52 can contact the sidewalls of the memory openings 49. Specifically, the blocking dielectric can contact the sidewalls of the sacrificial layers 42. The blocking dielectric 52 may include one or more dielectric material layers that can function as the dielectric material(s) of a control gate dielectric between the sacrificial layers 42 and a charge storage region to be subsequently formed. The blocking dielectric 52 can include silicon oxide, a dielectric metal oxide, a dielectric metal oxynitride, or a combination thereof. In one embodiment, the blocking dielectric 52 can include a stack of at least one silicon oxide layer and at least one dielectric metal oxide layer. The blocking dielectric 52 can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric 52 can be in a range from 6 nm to 24 nm, although lesser and greater thicknesses can also be employed. Alternatively, the blocking dielectric 52 may be omitted from the memory opening, and instead be formed through the backside contact trench in recesses formed by removal of the sacrificial layers 42 prior to forming the metal control gate electrodes through the backside contact trench.

Each charge storage region 54 includes a dielectric charge trapping material, which can be, for example, silicon nitride, or a conductive material such as doped polysilicon or a metallic material. In one embodiment, the charge storage region 54 includes silicon nitride. The charge storage region 54 can be formed as a single charge storage region of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage region 54 may comprise an insulating charge trapping material, such as one or more silicon nitride segments. Alternatively, the charge storage region 54 may comprise conductive nanoparticles such as metal nanoparticles, which can be, for example, ruthenium nanoparticles. The charge storage region 54 can be formed, for example, by chemical vapor deposition (CVD), atomic layer deposition (ALD), physical vapor deposition (PVD), or any suitable deposition technique for the selected material(s) for the charge storage region. The thickness of the charge storage region 54 can be in a range from 2 nm to 20 nm, although lesser and greater thicknesses can also be employed.

Each tunnel dielectric 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunnel dielectric 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunnel dielectric 56 can include a stack of a first silicon oxide layer, a silicon oxynitride layer, and a second silicon oxide layer, which is commonly known as an ONO stack. In one embodiment, the tunnel dielectric 56 can include a silicon oxide layer that is substantially free of carbon or a silicon oxynitride layer that is substantially free of carbon. The thickness of the tunnel dielectric 56 can be in a range from 2 nm to 20 nm, although lesser and greater thicknesses can also be employed.

Each semiconductor channel 60 can be formed on inner sidewalls of each memory film 50 by deposition of a semiconductor material layer and a subsequent anisotropic etch of the semiconductor material layer. The semiconductor material layer can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature.

Optionally, a dielectric core 62 can be formed within a cavity inside each semiconductor channel 60, for example, by deposition of a dielectric material such as silicon oxide, and subsequent planarization of the dielectric material. The planarization of the dielectric material removes the portion of the deposited dielectric material from above the top surface of the horizontal plane including the top surface of the alternating stack (32, 42). The planarization of the dielectric material can be performed, for example, by chemical mechanical planarization. Each remaining portion of the dielectric material inside a memory opening constitutes a dielectric core 62. The dielectric core 62 is an optional component, and a combination of a memory film 50 and a semiconductor channel 60 may completely fill a memory opening. A set of a memory film 50, a semiconductor channel 60, and a dielectric core 62 within a same memory opening constitutes a channel and memory structure 55.

Referring to FIG. 2I, additional trenches can be formed through the topmost sacrificial material layer 42 and the topmost insulator layer 32 in areas of the inter-electrode fill structures 31. The additional trenches are laterally-extending trenches, and can be formed, for example, by application and patterning of a photoresist layer over the topmost sacrificial material layer 42 and transfer of the pattern in the photoresist layer through the topmost sacrificial material layer 42 and the topmost insulator layer 32 by an anisotropic etch. In one embodiment, the pattern of the laterally-extending trenches through the topmost sacrificial material layer 42 and the topmost insulator layer 32 can be the same as the pattern of the inter-electrode fill structures 31. The photoresist layer can be subsequently removed, for example, by ashing.

Back side trenches (79A, 79B) can be formed on each side of the separator insulating material of the separator insulator structures 43. In one embodiment, each back side trench can be formed in a same configuration as the back side trench of FIG. 1 within which a combination of a source line 76 and a dielectric spacer 74 is formed. In other words, each back side trench (79A, 79B) can extend from the topmost surface of the alternating stack (32, 42) to the top surface of the substrate 8. A first back side trench 79A can be formed on a first side of the separator insulating material of each separator insulator structure 43, and a second back side trench 79B can be formed on a second side of the separator insulating material of each separator insulator structure 43.

Subsequently, the second material of the sacrificial material layers 42 can be removed selective to the first material of the insulator layers 32 to form control gate electrodes 46. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. An etchant that removes the second material of the sacrificial material layers 42 selective to the first material of the insulator layers 32 can be introduced through the back side trenches (79A, 79B) to laterally etch the second material of the sacrificial material layers 42 and to form back side recesses. For example, the sacrificial material layers 42 can be removed through the first and the second back side trenches (79A, 79B) to form respective first and second back side recesses. Upper select gate back side recesses can be formed in volumes from which the topmost sacrificial material layer 42 is removed. Lower select gate back side recesses can be formed in volumes from which the bottommost sacrificial material layer 42 is removed.

Figure 3A:
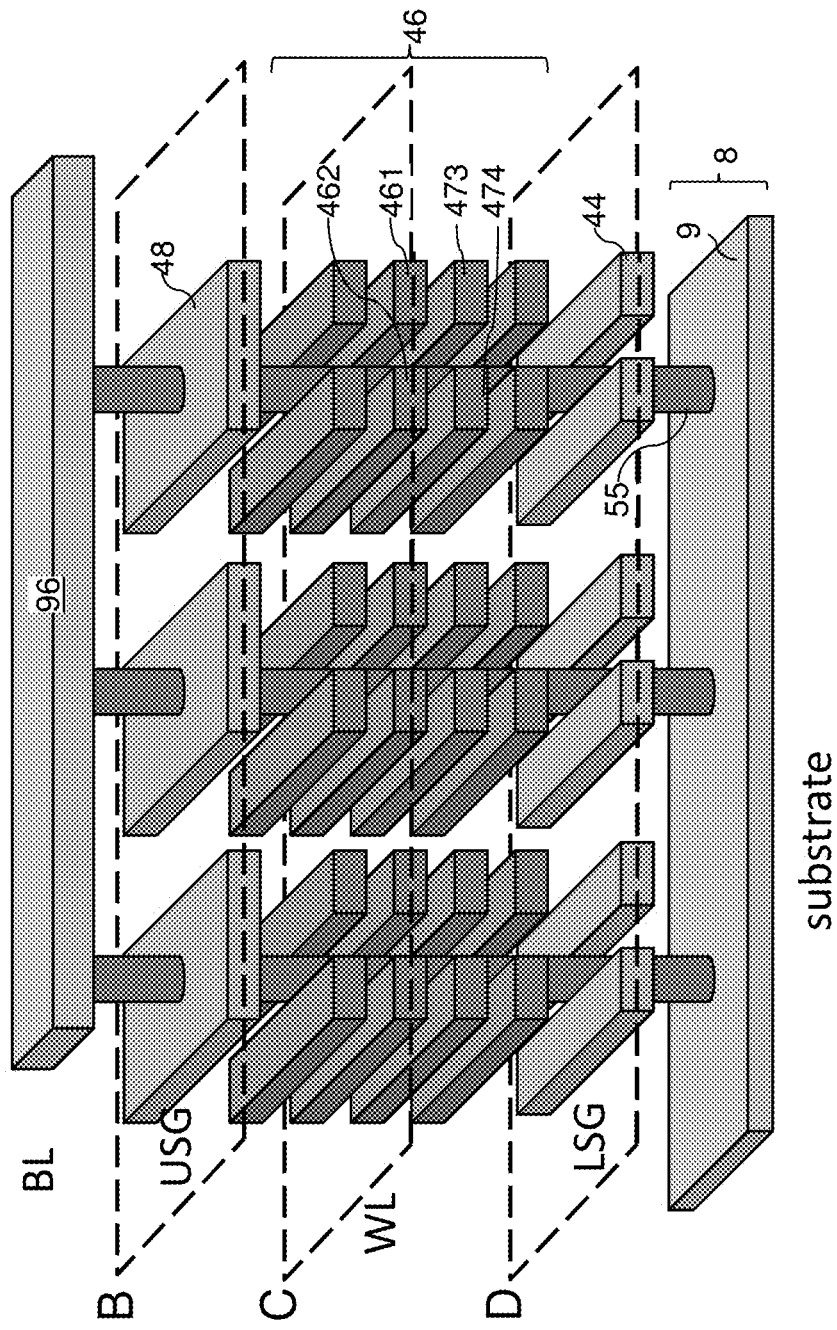
FIG. 3A is a bird's eye view of an array region of the first exemplary device structure according to the first embodiment of the present disclosure.

Referring to FIG. 2J, the back side recesses can be filled with a conductive material, for example, by chemical vapor deposition to form the control gate electrodes 46, drain-side select gate electrodes 48, and source-side select gate electrodes 44. First electrically conductive control gate layers can be formed in the first back side recesses through the first back side trench. The first electrically conductive control gate layers can include, for example, a first control gate electrode 461 and a third control gate electrode 473 illustrated in FIG. 3A. Second electrically conductive control gate layers can be formed in the second back side recesses through the second back side trench. The second electrically conductive control gate layers can include, for example, a second control gate electrode 462 and a fourth control gate electrode 474 illustrated in FIG. 3A.

An upper select gate layer can be formed in the upper select gate back side recess through the first and the second back side trenches (79A, 79B) such that the upper select gate layer surrounds the at least a portion of the memory film 50 located in the memory opening. The upper select gate layer includes drain-side select gate electrodes 48. A lower select gate layer can be formed in the lower select gate back side recess through the first and the second back side trenches (79A, 79B) such that separate lower select gate layers are located on opposite sides of the at least a portion of the memory film 50 located in the memory opening. The lower select gate layer includes source-side select gate electrodes 44.

The separator insulating material of a separator insulator structure 43 electrically insulates each first electrically conductive control gate layer from a respective second electrically conductive control gate layer located in a same device level. A first source line 76 (See FIG. 1) can be formed in each first back side trench 79A, and a second source line 76 (See FIG. 1) can be formed in each second back side trench 79B.

A pair of source-side select gate electrodes 44 can be formed for each memory stack structure 55. A first lower select gate layer 44A can be formed in a bottommost first back side recess through the first back side trench, and a second lower select gate layer 44B can be formed in another bottommost second back side recess through the second back side trench. The separator insulating material of a separator insulator structure 43 electrically insulates the first lower select gate layer 44A from the second lower select gate layer 44B.

The first exemplary device structure of FIG. 2J can be incorporated into the exemplary device structure of FIG. 1. The exemplary device structure of FIG. 1 that incorporates the first exemplary device structure of FIG. 2J is schematically illustrated in FIGS. 3A-3D.

Referring to FIGS. 3A-3D, a pair of source-side select gate electrodes 44, pairs of control gate electrodes 46, and a drain-side select gate electrode 48 can be provided around each memory stack structure 55. The substrate 8 can have a major surface 9. A first plurality of memory cells can be arranged in a first string, as embodied within a memory stack structure 55 and portions of gate electrodes in proximity thereto, extending in a first direction substantially perpendicular to the major surface 9 of the substrate 8 in a plurality of device levels. Each device level corresponds to the control gate electrodes 46 spaced from the major surface 9 by a same separation distance. Each of the first plurality of memory cells is positioned in a respective one of the plurality of device levels above the substrate 8.

A second plurality of memory cells can be arranged in a second string extending in the first direction, i.e., the vertical direction, and spaced apart from the first string in the second direction, i.e., a horizontal direction. The first and the second strings can extend through the insulating material between the first and the second control gate electrodes. The first and the second strings can share the first and the second select gate electrodes, i.e., the lower select gate electrodes 44 and the upper gate electrodes 48. The substrate 8 can comprise a silicon substrate. Each string of memory devices can be embodied as a memory stack structure 55 and portions of gate electrodes in proximity thereto, which is a monolithic three dimensional NAND string that can be located in a monolithic, three dimensional array of NAND strings located over the silicon substrate. At least one memory cell in the first device level of the three dimensional array of NAND strings can be located over another memory cell in the second device level of the three dimensional array of NAND strings. The silicon substrate can contain an integrated circuit comprising a driver circuit for the memory device located thereon.

At least one first select gate electrode, i.e., the source-side select gate electrodes 44, can be located between the major surface 9 of the substrate 8 and the first plurality of memory cells. At least one second select gate electrode, i.e., the drain-side select gate electrodes 48, can be located above the first plurality of memory cells. Each memory cell in the first string can comprise a portion of a first control gate electrode 461 extending in a second direction (i.e., a horizontal direction along the lengthwise direction of the control gate electrodes 46) substantially parallel to the major surface 9, and a portion of a second control gate electrode 462 extending in the second direction, located at a same level as the respective first control gate electrode 461, and spaced apart from the respective first control gate electrode 461 in a third direction substantially parallel to the major surface 9 and transverse to the second direction. For each memory cell in the first string, the respective first control gate electrode 461 is electrically insulated from the respective second control gate electrode 462 by a separator insulator structure 43.

Each memory cell comprises a first portion of a memory film 50 (See FIG. 1) which is located between the first control gate electrode 461 and a first portion of a semiconductor channel 60, and a second portion of the memory film 50 which is located between the second control gate electrode 462 and a second portion of the semiconductor channel 60. At least one end portion of the semiconductor channel 60 extends substantially perpendicular to the major surface 9 of a substrate 8. The memory film 50 can comprise a blocking dielectric 52 (See FIG. 2H) in contact with the first and the second control gate electrodes (461, 462), at least one charge storage region that is a portion of the charge storage region 54 in contact with the blocking dielectric 52, and a tunnel dielectric 56 located between the at least one charge storage region and the semiconductor channel 60.

Locations of upper select gate contacts 85 are schematically illustrated in FIG. 3B. The upper select gate electrodes 48 are located on the upper side of the word line array. The upper select gate electrodes 48 can be divided and individually controlled per memory opening array. The word lines can be in a comb configuration. The word line terrace can be in the contact region 300, which is the location for word line contacts. The lower select gate electrodes 44 can be divided in a comb configuration. The operating voltages of the lower select gate electrodes 44 can be the same for all lower select gate electrodes 44.

The exemplary device structure can include a stack comprising a plurality of control gate electrodes 46 extending in the second direction. The plurality of control gate electrodes 46 comprise the first and second control gate electrodes (461, 462) located in a first device level, and third and fourth control gate electrodes (473, 474) located in a second device level located over the major surface 9 of the substrate 8 and below the first device level. The stack further comprises an interlevel insulator layer, i.e., an insulator layer 32, located between the first and the second control gate electrodes (461, 462) in the first device level and the third and the fourth control gate electrodes (473, 474) located in the second device level. The insulating material of the dielectric core 62 can be located in a separator trench 47 (See FIG. 2D), i.e., the memory opening, in the stack, and can separate the stack into a first portion and a second portion.

The exemplary device structure can include a device region 100 comprising a first plurality of memory cells, in which each memory cell is embodied in a memory stack structure 55 and portions of gate electrodes in proximity thereto. The exemplary device structure can further include a first stepped contact region 300 located on a first side of the device region 100 and a second stepped contact region 400 located on a second side of the device region 100 opposite to the first side. A first control gate electrode 461 for each memory stack structure 55 can comprise a first prong of a first word line, and a second control gate electrode 462 for each memory stack structure can comprise a second prong of a second word line. Bit lines 96 laterally extending in directions different from the lengthwise directions of the control gate electrodes 46 are electrically connected to a set of memory stack structures 55, Referring to FIG. 3B, the semiconductor channel 60 within each memory stack structure 55 extends through a second select gate electrode, i.e., an upper select gate electrode 48, which comprises a select line having a contact 85 in the device region 100.

Referring to FIG. 3C, a first word line can comprise a comb shaped word line 410 having a terrace contact portion 412 located in the first stepped contact region 300 and a plurality of prongs (461, 463, 465) extending from the terrace contact portion 412 into the device region 100. The second word line can comprise a comb shaped word line 420 having a terrace contact portion 422 located in the second stepped contact region 400 and a plurality of prongs (462, 464, 466) extending from the terrace contact portion 422 into the device region 100. The prongs (461, 463, 465) of the first word line 410 can be interdigitated with the prongs (462, 464, 466) of the second word line 420. Each prong (461, 462, 463, 464, 465, 466) of the word lines (410, 420) can be control gate electrodes. The semiconductor channel 60 (See FIG. 2H) and the memory film 50 (See FIG. 2H) can be located between the first control gate electrode 461 and the second control gate electrode 462.

Figure 3D:
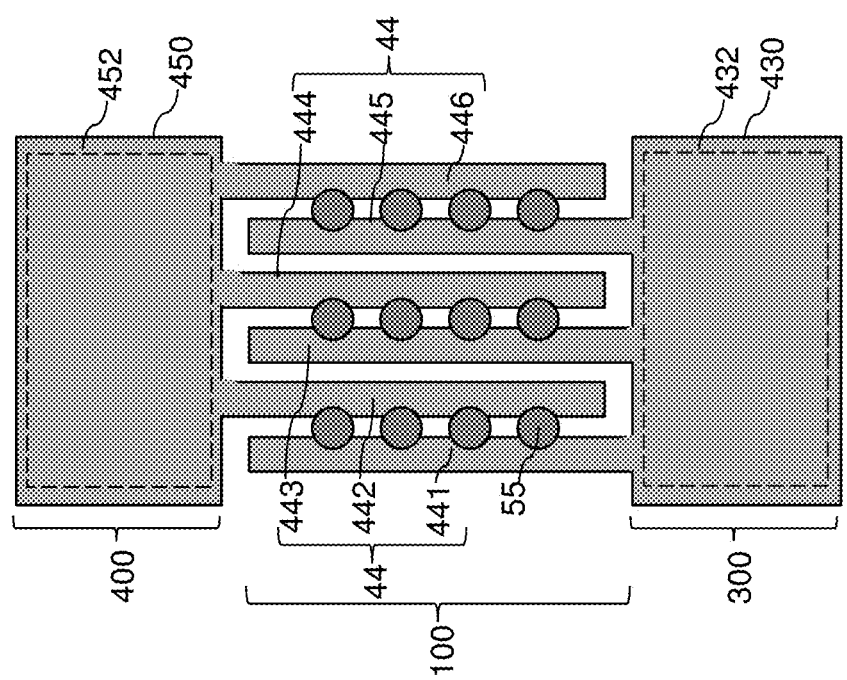

Referring to FIG. 3D, a first select gate electrode, such as a first lower select gate electrode 441, can comprise a prong of a first select line. The first select line can comprise a comb shaped select line 430 having a terrace contact portion 432 located in the first stepped contact region 300 and a plurality of prongs (441, 443, 445) extending from the terrace contact portion 432 into the device region 100 below the plurality of control gate electrodes 46. A second lower select gate electrode 442 can comprise a prong of a second select line located between the major surface 9 of the substrate 8 and the first plurality of memory cells. The second select line can comprise a comb shaped select line 450 having a terrace contact portion 452 located in the second stepped contact region 400 and a plurality of prongs (442, 444, 446) extending from the terrace contact portion 452 into the device region 100. The prongs of the first select line can be interdigitated with the prongs of the second select line. A semiconductor channel 60 (See FIG. 1) is located between the first select gate electrode 441 and the second select gate electrode 442.

The exemplary device comprises a plurality of semiconductor channels 60 (See FIG. 1) and memory films 50 (See FIG. 1) extending in the first direction between the first and the second control gates electrodes (461, 462).

Figure 4A:
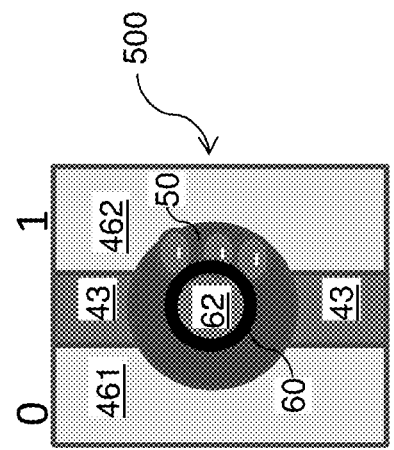
FIGS. 4A-4D are schematic horizontal cross-sectional views of a memory cell within the first exemplary device structure during various programmed states according to the first embodiment of the present disclosure.

Referring to FIG. 4A, the first control gate electrode 461 can be located in the first portion of the stack, and the second control gate electrode 462 can be located in the second portion of the stack. The second control gate electrode 462 can be insulated from the first control gate electrode 461 by the insulating material located in a separator trench 47, i.e., a separator insulator structure 43 (See FIGS. 2D and 2E).

As shown in FIG. 4A. the first portion 50A of the memory film 50 can be electrically connected to the second portion 50B of the memory film 50, and the first portion of the semiconductor channel 60 (i.e., the portion of the semiconductor channel that contacts the first portion 50A of the memory film 50) can be electrically connected to the second portion of the semiconductor channel 60 (i.e., the portion of the semiconductor channel that contacts the second portion 50B of the memory film 50). In one embodiment, the semiconductor channel 60 comprises a cylindrical hollow body surrounding a dielectric core 62. The memory film 50 comprises a cylindrical hollow body surrounding the semiconductor channel 60. The memory film 50, the semiconductor channel 60, and the dielectric core 62 together comprise a pillar, i.e., a memory stack structure 55, which extends in the first direction (e.g., the vertical direction) through the insulating material of the separator insulator structure 43 located in the separator trench 47. The first portion 50A of the memory film 50 contacts the first control gate electrode 461, and the second portion 50B of the memory film 50 contacts the second control gate electrode 462.

The NAND memory device can comprise a substrate 8 having a major surface 9. The first plurality of memory cells are arranged in the first NAND string extending in a first direction substantially perpendicular to the major surface 9 of the substrate 8 in a plurality of device levels. Each of the first plurality of memory cells is positioned in a respective one of the plurality of device levels above the substrate 8. A first select gate electrode, e.g., a lower select gate electrode 44, is located between the major surface 9 of the substrate 8 and the first plurality of memory cells, and a second select gate electrode, e.g., an upper select gate electrode 48, is located above the first plurality of memory cells. The first control gate electrode 461 extends in a second direction substantially parallel to the major surface 9, and the second control gate electrode 462 extends in the second direction and spaced apart from the respective first control gate electrode in a third direction substantially parallel to the major surface 9 and transverse to the second direction. Each memory cell can comprise a first portion 50A of a memory film 50 which is located between the first control gate electrode 461 and a first portion of a semiconductor channel 60, and a second portion 50B of the memory film 50 which is located between the second control gate electrode and a second portion of the semiconductor channel 60. The first portion 50A of the memory film 50 is electrically connected to the second portion 50B of the memory film 50, and the first portion of the semiconductor channel 60 is electrically connected to the second portion of the semiconductor channel 60.

Figure 4B:
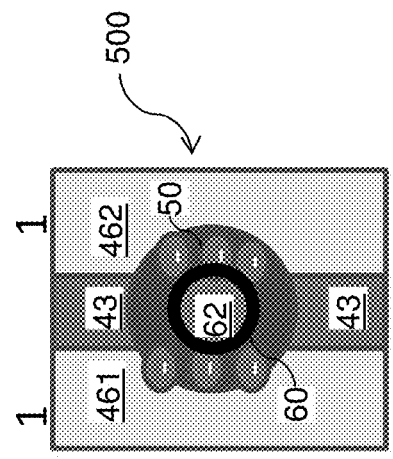
Figure 4C:
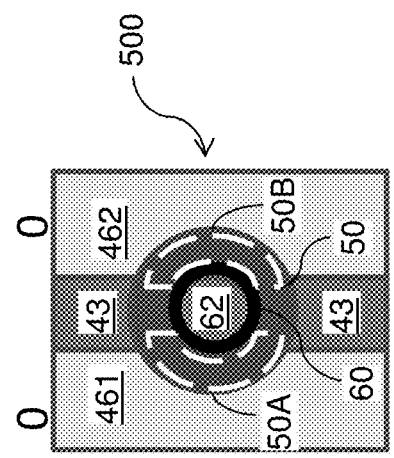
Figure 4D:
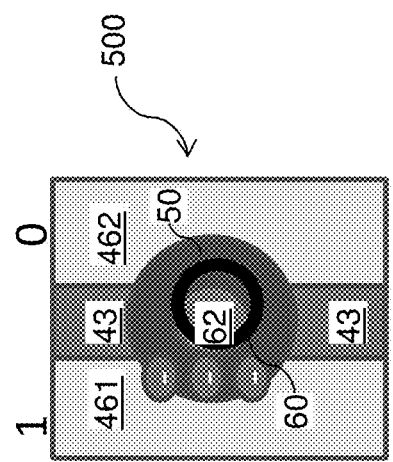

Each memory cell 500 within a memory stack structure 55 comprises a multi-level program cell, i.e., a multi-charge storage state cell, having multiple states such as an unprogrammed state illustrated in FIG. 4A and a plurality of (such as the illustrated three) distinct programmed states illustrated in FIGS. 4B-4D. In the unprogrammed state, electrical charges are substantially absent in a first portion 50A of the memory film 50 that contacts the first control gate electrode 461, and are substantially absent in a second portion 50B of the memory film that contacts the second control gate electrode 50B462. In a first programmed state, electrical charges are substantially absent in a first portion 50A of the memory film 50 that contacts the first control gate electrode 461, and are present in a second portion 50B of the memory film that contacts the second control gate electrode 462. In a second programmed state, electrical charges are present in a first portion 50A of the memory film 50 that contacts the first control gate electrode 461, and are substantially absent in a second portion 50B of the memory film that contacts the second control gate electrode 462. In a third programmed state, electrical charges are present in a first portion 50A of the memory film 50 that contacts the first control gate electrode 461, and are present in a second portion 50B of the memory film that contacts the second control gate electrode 462.

Figure 5:
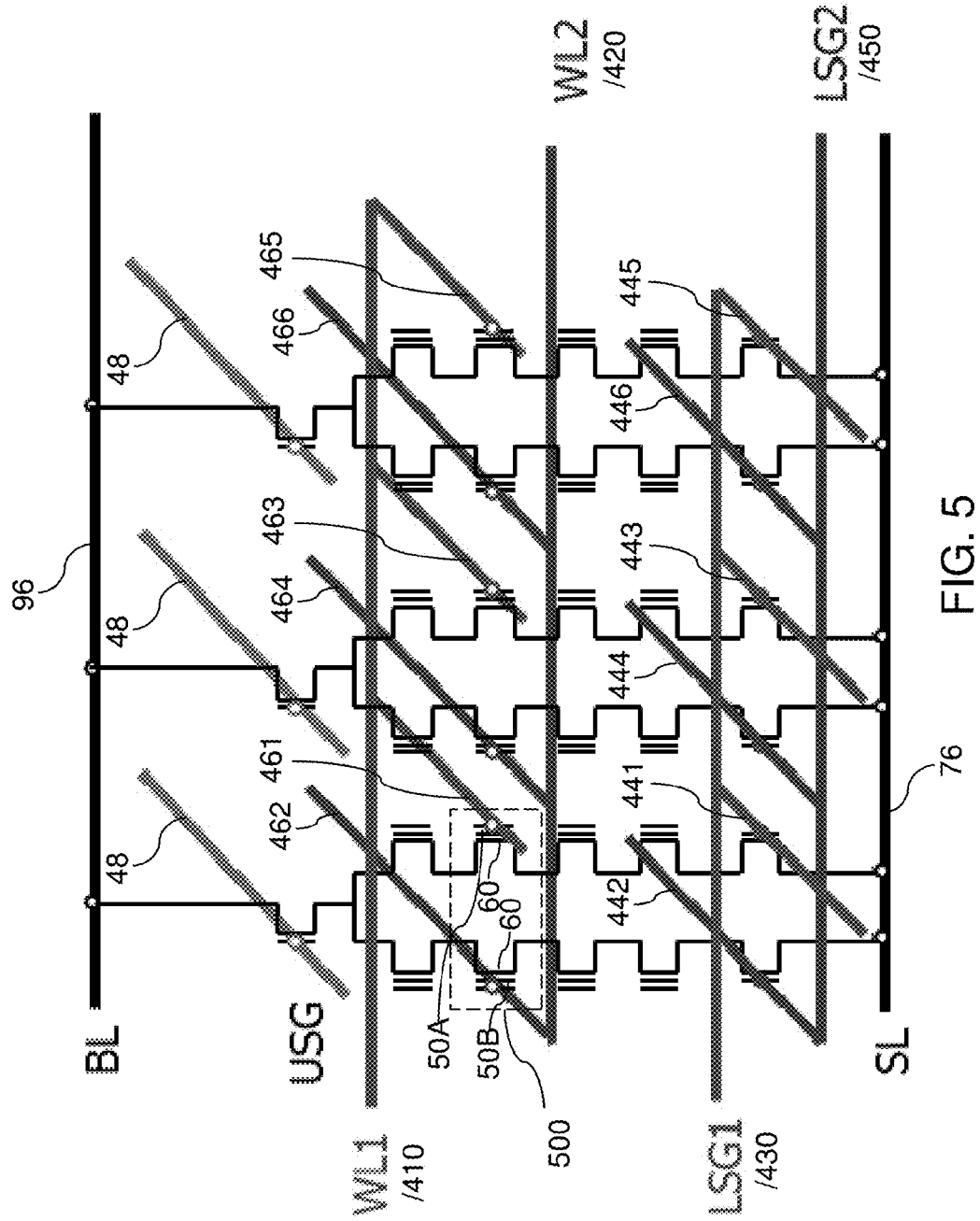
FIG. 5 is a circuit schematic of the array region of the first exemplary device structure according to the first embodiment of the present disclosure.

Referring to FIG. 5, a circuit schematic of the array region of the first exemplary device structure is illustrated. The circuit schematic represents a plurality of NAND strings. Each NAND string comprises a plurality of memory cells. Each memory cell in the NAND string comprises a portion of a first control gate electrode 461 (See FIGS. 4A-4D) located adjacent to a first portion 50A of a memory film 50 and a portion of a second control gate electrode 462 which is located adjacent to a second portion 50B of the memory film 50. The second control gate electrode 462 is electrically insulated from the first control gate electrode 461.

Referring to FIGS. 3A-3D, 4A-4D, and 5 collectively, each memory cell 500 of the NAND memory device can be read by applying a select read voltage of a first polarity type to the first control gate electrode 461, and by applying an unselect read voltage of a second polarity type opposite to the first polarity type to the second control gate electrode 462 during the step of applying the select read voltage to the first control gate electrode 461. For example, the select read voltage can comprise a positive voltage used to read a programmed first portion of the memory cell containing the first portion 50A of the memory film 50, and the unselect read voltage comprises a negative voltage which inhibits a read current from flowing through the second portion of the memory film located in an erased second portion 50B of the memory cell 50.

In a non-limiting illustrative example, a read operation of on a memory cell can be performed by applying a voltage of about 3.0 V to a selected upper select gate electrode USG, a voltage of about 0 V to an unselected upper select gate electrode, a selected-line read voltage of about 4.0 V to a selected word line (e.g., WL1/410) connected to the selected control gate electrode (e.g., a first control gate electrode 461), an unselected-same-level-line read voltage of about −3.0 V to the unselected control gate electrode (e.g., WL2/420) within a pair of control gate electrodes for the memory cell at the same level (e.g., a second control gate electrode 462), and an unselected-different-level-line read voltage of about 7.0 V to all other control gate electrodes 46 located at different levels. A voltage of about 3.0 V can be applied to the selected lower select gate electrode (e.g., LSG1/430), and a voltage of about 3.0 V can be applied to the unselected lower select gate electrode (e.g., LSG2/450) connected to the same memory stack structure 55 (See FIG. 1). A voltage of about 0 V is applied to unselected lower select gate electrodes 48 connected to the different memory stack structure 55. A voltage of about 1.0 V can be applied to the selected bit line BL/96, and a voltage of about 0 V can be applied to the unselected bit lines (not shown). The source line SL/76 can be biased at about 0 V. The various voltages can be scaled and/or adjusted as needed. Unselected word lines (e.g., WL2/420) in the same level as the selected control gate electrode 461 can be set at a voltage of the opposite polarity as the selected-line read voltage (e.g., a negative voltage of about −3.0 V) to suppress leak current along the intermediate and opposite area of selected word line (e.g., WL1/410) during the read operation.

In a non-limiting illustrative example, a programming operation of on a memory cell can be performed by applying a voltage of about 3.0 V to a selected upper select gate electrode USG, a voltage of about 0 V to an unselected upper select gate electrode, a selected-line programming voltage of about 20 V to a selected word line (e.g., WL1/410) connected to the selected control gate electrode (e.g., a first control gate electrode 461), and an unselected programming voltage of about 7.0 V to all unselected control gate electrodes (e.g., WL2/420). A voltage of about 0 V can be applied to all lower select gate electrode (e.g., LSG1/430, LSG2/450). A voltage of about 0 V can be applied to the selected bit line BL/96, and a voltage of about 3.0 V can be applied to the unselected bit lines (not shown). The source line SL/76 can be biased at about 3.0 V.

In a non-limiting illustrative example, an erase operation of on a memory cell can be performed by applying a voltage of about 12.0 V to all upper select gate electrodes USG, an erase word line voltage of about 0 V to all word lines. A voltage of about 12.0 V can be applied to all lower select gate electrode (e.g., LSG1/430, LSG2/450). A voltage of about 20 V can be applied to all bit lines BL/96. The source line SL/76 can be biased at about 20 V.

Referring to FIGS. 6A and 6B, a cut-out portion of a second exemplary device structure according to a second embodiment of the present disclosure is illustrated. An array region of a second exemplary device structure is illustrated. The second exemplary device structure is a portion of an array region that can be embedded within the exemplary device structure of FIG. 1. An alternating stack (32, 42) of insulator layers 32 and sacrificial material layers 42 is formed over a substrate 8. The alternating stack (32, 42) can be the same as in the first embodiment. The bottommost sacrificial material layer 32 may have a plurality of lower insulating separators 25 embedded therein. The lower insulating separators 25 provide electrical isolation between various lower select gate electrodes to be subsequently formed.

An upper select gate electrode layer and another insulator layer 32 can be sequentially formed. The upper select gate electrode layer can be another sacrificial material layer 42, or can be a conductive material layer including a conductive material such as doped polysilicon. The upper select gate electrode layer may have a plurality of upper insulating separators 45 embedded therein. The upper insulating separators 45 provide electrical isolation between various upper select gate electrodes to be subsequently formed. Separator trenches 47 can be formed through the topmost insulator layer 32, the upper select gate electrode layer, and the alternating stack (32, 42) of insulator layers 32 and sacrificial material layers 42. The separator trenches 47 can be formed, for example, by application and patterning of a photoresist layer over the topmost insulator layer 32, and transfer of the pattern in the patterned photoresist layer through the topmost insulator layer 32, the upper select gate electrode layer, and the alternating stack (32, 42) to the top surface of the substrate 8 (e.g., the top surface of the substrate semiconductor layer 10 or an etch stop layer, if present) that is located at the bottom of the alternating stack (32, 42). The separator trenches 47 laterally extend along a horizontal direction. In one embodiment, the separator trenches 47 can have a substantially uniform width, and can be parallel among one another. The separator trenches 47 can laterally divide the alternating stack (32, 42) into a plurality of portions. If the select gate electrode layer includes a conductive material, the remaining portions of the select gate electrode layer can constitute an upper select gate electrode 48.

Referring to FIGS. 7A and 7B, the processing steps of FIG. 2E can be performed to fill each separator trench 47 with a dielectric material that is different from the second material. Excess portions of the dielectric material can be removed from above the top surface of the alternating stack, for example, by chemical mechanical planarization (CMP), a recess etch, or a combination thereof. Remaining portions of the deposited dielectric material constitutes separator insulator structures 43. In one embodiment, the separator insulator structures 43 can laterally separate various portions of the alternating stack (32, 42).

Referring to FIGS. 8A and 8B, memory openings 49 can be formed through the topmost insulator layer 32, the upper select gate electrodes 48, and the alternating stack (32, 42) by application of a photoresist layer over the topmost insulator layer 32, lithographic patterning of the photoresist layer, and transfer of the pattern in the photoresist layer through the topmost insulator layer 32, the upper select gate electrodes 48, and the alternating stack (32, 42) by an anisotropic etch such as a reactive ion etch. The photoresist layer can be subsequently removed, for example, by ashing. Each memory opening 49 extends through the insulating cover layer, i.e., the topmost insulator layer 32, and through the upper select gate electrodes 48, and the underlying alternating stack (32, 42) of insulator layers 32 and sacrificial material layers 42. Each memory opening 49 can vertically extend from the top surface of the alternating stack (32, 42) to the top surface of the substrate 8 (e.g., the top surface of the substrate semiconductor layer 10 or an etch stop layer, if present) that is located at the bottom of the alternating stack (32, 42). Each memory opening 49 can extend through a portion of a separator insulator structure 43. In other words, a memory opening 49 can divide a separator insulator structure 43 into two physically disjoined portions. Each memory opening 49 in the alternating stack (32, 42) can extend through the separator insulating material located in the separator insulator structures 43, and divides a separator insulator structure 43 into two laterally disjoined portions.

Figure 9A:
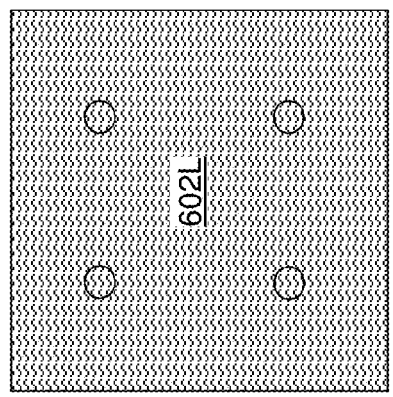
FIG. 9A is a top-down view of the array region of the second exemplary device structure after formation of blocking dielectrics, charge storage material layers, tunnel dielectrics, and first semiconductor channels according to the second embodiment of the present disclosure.
Figure 9B:
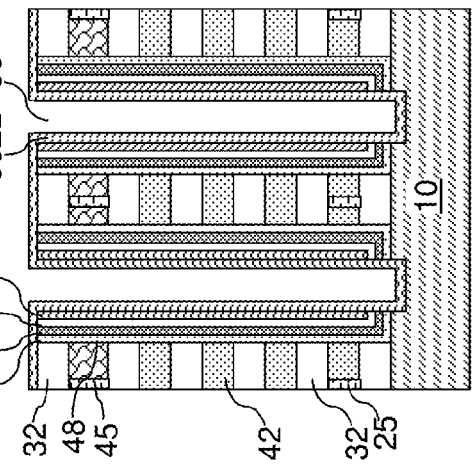
FIG. 9B is a vertical cross-sectional view of the second exemplary device structure of FIG. 9A.

Referring to FIGS. 9A and 9B, at least a portion of a memory film 50 is formed in each memory opening. For example, a blocking dielectric layer can be formed in the memory opening, at least one charge storage region can be formed in the memory opening, and a tunnel dielectric can be formed in the memory opening. In one embodiment, the at least one charge storage region can comprises a charge trapping dielectric layer. A blocking dielectric 52, a charge storage region 54, a tunnel dielectric 56, and a first semiconductor channel portion 601 can be sequentially formed. Each of the blocking dielectric 52, the charge storage region 54, and the tunnel dielectric 56 can be the same as in the first embodiment. The first semiconductor channel portion 601 can be a first material portion employed to form a semiconductor channel 60 (See FIG. 1). Each stack of a blocking dielectric 52, a charge storage region 54, a tunnel dielectric 56, and a first semiconductor channel layer can be formed, for example, by depositing, and subsequently anisotropically etching, a stack including a blocking dielectric layer, a charge storage material layer, a tunnel dielectric layer, and a first semiconductor channel layer. Optionally, a first amorphous carbon cover layer can be formed over the first semiconductor channel layer prior to the anisotropic etching process, and can be removed after the anisotropic etching process. The first semiconductor channel layer can be a doped semiconductor material layer or an undoped semiconductor material layer. For example, the first semiconductor channel layer can be a doped polysilicon layer or an undoped polysilicon layer. A top surface of the substrate semiconductor layer 10 can be physically exposed at the bottom of each memory opening 49 after the anisotropic etch.

Figure 10A:
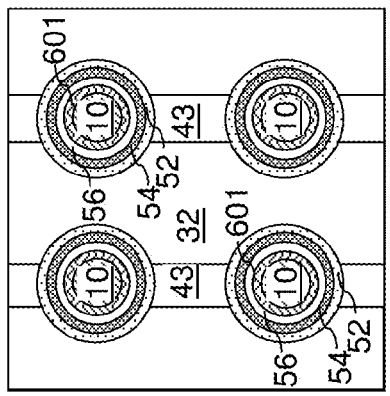
FIG. 10A is a top-down view of the array region of the second exemplary device structure after formation of second semiconductor channels according to the second embodiment of the present disclosure.
Figure 10B:
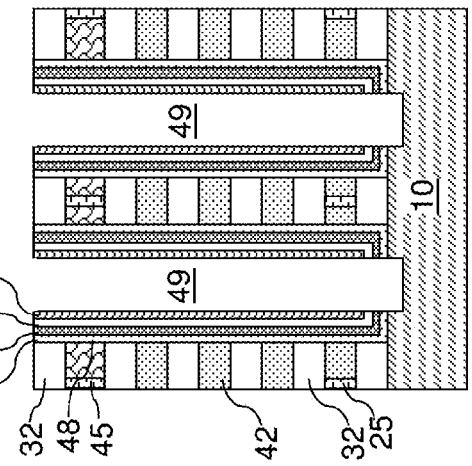
FIG. 10B is a vertical cross-sectional view of the second exemplary device structure of FIG. 10A.

Referring to FIGS. 10A and 10B, an optional second semiconductor channel layer 602L can be deposited on the physically exposed top surfaces of the substrate semiconductor layer 10 and sidewalls of the first semiconductor channel portions 601 and over the topmost insulator layer 32. The second semiconductor channel layer 602L can be a doped semiconductor material layer or an undoped semiconductor material layer. For example, the second semiconductor channel layer 602L can be a doped polysilicon layer or an undoped polysilicon layer. In one embodiment, the second semiconductor channel layer 602L does not completely fill the cavity in each memory opening. In another embodiment, the second semiconductor channel layer 602L completely fills the cavities in the memory openings.

Referring to FIGS. 11A and 11B, a photoresist layer 67 can be applied over the second semiconductor material layer 62L and can be lithographically patterned to form openings therein. At least one opening in the patterned photoresist layer can have a shape that straddles a memory opening and overlies two separator insulator structures 43 that adjoin the memory opening. Further, the shape has a width that is less than the width of the underlying memory opening along a horizontal direction that is perpendicular to the horizontal direction passing through centers of the two separator insulator structures 43. Specifically, the width of the shape of an opening can be selected such that a lateral stack of a portion of a blocking dielectric 52, a portion of a charge storage region 54, a portion of a tunnel dielectric 56, a portion of a first semiconductor channel portion 601, and a portion of the second semiconductor channel layer 602L is present on each side of the area defined by the shape of the opening. In one embodiment, each opening in the photoresist layer 67 may have a lengthwise direction that is parallel to the horizontal direction passing through centers of the two separator insulator structures 43. In one embodiment, each opening in the photoresist layer 67 may be of rectangular shape or of elliptical shape.

At each memory opening, a separation opening 69 can be formed through the semiconductor channel 60 and the memory film 50 to separate the semiconductor channel 60 and the memory film 50 into a first portion and a second portion along a direction parallel to the separating insulating material of the separator insulator structures 43. Each separation opening 69 can be formed underneath each opening in the photoresist layer 67 by etching through portions of the second semiconductor channel layer 602L and the separator insulator structures 43 that underlie the openings employing an anisotropic etch, which can be a reactive ion etch. If the memory openings are filled with the second semiconductor channel layer 602L, the anisotropic etch can be a nonselective etch that etches the semiconductor material of the second semiconductor channel layer 602L and the dielectric material of the separator insulator structures 43 at approximately the same etch rate. Alternatively, multiple etch chemistries may be employed to form the separation openings 69. Optionally, a first amorphous carbon cover layer can be formed over the first semiconductor channel layer prior to the anisotropic etching process, and can be removed after the anisotropic etching process.

Each stack of a blocking dielectric 52, a charge storage region 54, a tunnel dielectric 56, a first semiconductor channel portion 601, and a vertical portion of the second semiconductor channel layer 602L within a memory opening is physically divided into two laterally separated stacks. Each of the laterally separated stacks include a blocking dielectric 52, a charge storage region 54, a tunnel dielectric 56, a first semiconductor channel portion 601, and a vertical portion of the second semiconductor channel layer 602L. The lateral separation distance between the disjoined pair of stacks of a blocking dielectric 52, a charge storage region 54, a tunnel dielectric 56, a first semiconductor channel portion 601, and a vertical portion of the second semiconductor channel layer 602L can be the same as the width of the separation opening 69 therebetween. Each separation opening 69 can extend at least from the top surface of the topmost insulator layer 32 to the top surface of the substrate semiconductor layer 10. Subsequently, the photoresist layer 67 can be removed, for example, by ashing.

Referring to FIGS. 12A and 12B, a dielectric core 162 can be formed within each core cavity 69, for example, by deposition of a dielectric material such as silicon oxide, and subsequent planarization of the dielectric material. The planarization of the dielectric material removes the portion of the deposited dielectric material from above the top surface of the horizontal plane including the top surface of the alternating stack (32, 42). The planarization of the dielectric material can be performed, for example, by chemical mechanical planarization. The top portion of the second semiconductor channel layer 602L can be removed during the planarization process. Each remaining portion of the second semiconductor channel layer 602L constitutes a second semiconductor channel portion 602. Each adjoining pair of a first semiconductor channel portion 601 and a second semiconductor channel portion 602 can be a portion of a semiconductor channel, which may optionally further include a horizontal top portion of the substrate semiconductor layer 10. Each remaining portion of the dielectric material inside a memory opening constitutes a dielectric core 162. A combination of a portion of the dielectric core 162 and a pair of combinations of a memory film 50 and a semiconductor channel 60 may completely fill the volume of a memory opening as formed at the processing step of FIGS. 8A and 8B. Thus, two memory elements can be formed per memory opening at each level.

Subsequently, the second material of the sacrificial material layers 42 can be removed selective to the first material of the insulator layers 32 to form control gate electrodes 46, and optionally lower select gate electrodes and/or upper select gate electrodes 48. The processing steps of FIG. 2J of the first embodiment may be employed to form the control gate electrodes 46, and optionally lower select gate electrodes and/or upper select gate electrodes 48.

The separator insulating material of the separator insulator structures 43 electrically insulates each first electrically conductive control gate layer from a respective second electrically conductive control gate layer located in a same device level. Further, each dielectric core 162 laterally contacts a pair of separator insulator structures 43, and provides electrical isolation between a pair of memory elements located at the same level and in, and around, the same memory opening. A source line 76 (See FIG. 1) can be formed in each back side trench 79 employed to fill the back side recesses formed by removal of the sacrificial material layers 42.

Figure 13:
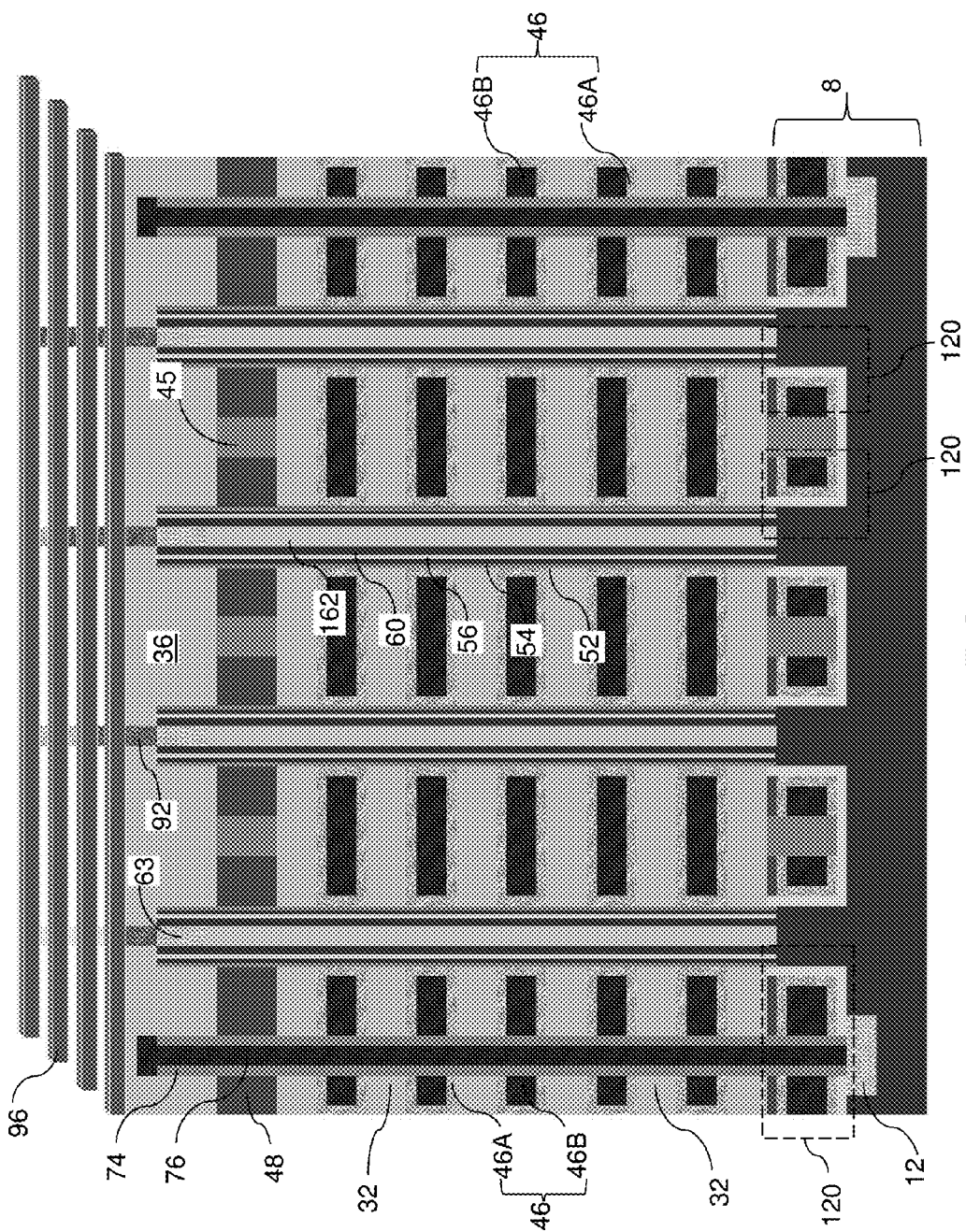
FIG. 13 is a vertical cross-sectional view of the second exemplary device structure after formation of bit lines according to the second embodiment of the present disclosure.

The second exemplary device structure of FIGS. 12A and 12B can be incorporated into the exemplary device structure of FIG. 1 or derivatives therefrom. FIG. 13 illustrates the second exemplary device structure upon such incorporation. Each portion of the sacrificial material layers 42 can be replaced with a conductive electrode 46, which can include, for example, an optional conductive liner 46A (including, for example, titanium nitride) and a conductive fill material portion 46B (including, for example, tungsten). A drain region 63 can be formed at a top end of each combination of a memory film 50 and a semiconductor channel 60. Contact via structures 92 can be formed on each drain region 63, and bit lines 96 can be formed directly on the contact via structures 92 to access the drain regions 63. A pair of semiconductor channels 60 can be formed in each memory opening over at least a portion of the pair of memory films 50.

Source-side select transistors 120 may be provided in the exemplary device structure. Within each memory opening, a first portion of a memory film 50 located on the first side of the dielectric core 162 is electrically insulated from a second portion of the memory film 50 located on the second side of the dielectric core 162. Within each memory opening, the dielectric core 162 electrically insulates a first portion of the semiconductor channel 60 located on the first side of the dielectric core 162 from a second portion of the semiconductor channel 60 located on the second side of the dielectric core 162.

Referring to FIGS. 14A and 14B, a cut-out portion of an array region of a third exemplary device structure is shown, which can be the same as the second exemplary device structure of FIGS. 6A and 6B.

Referring to FIGS. 15A and 15B, the processing steps of FIGS. 7A and 7B are performed to form separator insulator structures 43 by filling the separator trenches 47 with a separator insulator material.

Referring to FIGS. 16A and 16B, the processing steps of FIGS. 8A and 8B are performed to form memory openings 49. The shape and sizes of the memory openings 49 can be selected such that the memory openings 49 do not merge with one another upon a selective expansion process to be subsequently employed. In one embodiment, the horizontal cross-sectional area of each memory opening 49 can be elliptical or roughly polygonal (e.g., roughly square or rectangular with rounded corners) In one embodiment, each memory opening 49 can extend through the entire thickness of the separator insulator material of the separator insulator structures 43. Each memory opening 49 can separate a separator insulator structure 43 into two physically disjoined portions.

Referring to FIGS. 17A-17C, front side recesses 49A are formed in the sacrificial material layers 42 through the memory openings 49. The front side recesses 49A can be formed, for example, by a selective etch process in which the sacrificial material of the sacrificial material layer 42 is etched selective to the insulator material of the insulator layers 32. Optionally, the selective etch process can be selective to the conductive material of the upper select gate electrodes 48. The selective etch process laterally recesses the sidewalls of the sacrificial material layer 42 farther away from each memory opening 49 than sidewalls of adjoining insulator layers 32. The distance of the lateral recess for the front side recesses 49A can be selected such that the front side recesses 49A from neighboring memory openings 49 do not merge after termination of the selective etch process. In one embodiment, the front side recesses 49A can have an annular shape.

Referring to FIGS. 18A-18C, a blocking dielectric layer 52L can be formed in the memory opening 49 by a conformal deposition method such as chemical vapor deposition or atomic layer deposition. The dielectric material of the blocking dielectric layer 52L can be the same as the dielectric material of the blocking dielectric 52 in FIG. 2H. The thickness of the blocking dielectric layer 52L can be selected such that the front side recesses 49A are not filled by the blocking dielectric layer 52L. In one embodiment, the thickness of the blocking dielectric layer 52L can be in a range from 6 nm to 24 nm, although lesser and greater thicknesses can also be employed.

Subsequently, a charge storage layer 54L can be deposited on the surfaces of the blocking dielectric layer 52L. The charge storage layer 54L can have the same composition as, or can have a different composition from, the charge storage region 54 in FIG. 2H. The charge storage layer 54L can be deposited by a conformal deposition method such as chemical vapor deposition or atomic layer deposition. The charge storage layer 54L of the third embodiment can include a conductive material or a dielectric material. In one embodiment, the charge storage layer 54L can include a floating gate material, which can be a conductive material such as at least one metal and/or a doped polysilicon. In another embodiment, the charge storage layer 54L can be a charge trapping dielectric layer such as a silicon nitride layer. The thickness of the charge storage layer 54L can be selected such that the front side recesses 49A are filled by the charge storage layer 54L without completely filling a center portion of each memory opening 49. The thickness of the charge storage layer 54L, as measured on vertical surfaces of the blocking dielectric layer 52L outside of the front side recesses 49A, can be in a range from 3 nm to 60 nm, although lesser and greater thicknesses can also be employed. Thus, a cavity 49' is present at a center portion of each memory opening 49 after the charge storage layer 54L fills the front side recesses 49A of the memory opening 49.

Referring to FIGS. 19A-19C, the portions of the blocking dielectric layer 52L and the charge storage layer 54L that do not underlie the topmost insulator layer 32 can be removed by an etch process, which can be an anisotropic etch, an isotropic etch, or a combination of an anisotropic etch and an isotropic etch. The cavity 49' within each memory opening expands by the volume of the removed portions of the blocking dielectric layer 52L and the charge storage layer 54L so that the volume of the cavity 49' is equal to, or greater than, the original volume of the memory opening 49 as formed at the processing steps of FIGS. 16A and 16B. The sidewall surfaces of the insulator layers 32 and the upper select gate electrodes 48 can be physically exposed after the etch process.

Each remaining portion of the blocking dielectric layer 52L constitutes a blocking dielectric 52. Each remaining portion of the charge storage layer 54L constitutes a charge storage region 54. A pair of mutually disjoined blocking dielectrics 52 is present at each level of a memory opening. A pair of mutually disjoined charge storage regions 54 is present at each level of the memory opening. Each blocking dielectric 52 contacts sidewall surfaces of two separator insulator structures 43. Each charge storage region 54 is spaced from the separator insulator structures 43 by a blocking dielectric 52. Each blocking dielectric 52 can have a convex outer surface and a concave inner surface. Surfaces of each blocking dielectric 52 are physically exposed to a cavity 49'. The blocking dielectrics 52 are formed in the front side recesses 49A of through the memory opening. In one embodiment, the charge storage regions 54 can be a plurality of floating gates.

Referring to FIGS. 20A-20C, a tunnel dielectric 56 and a first semiconductor channel portion 601 can be formed within each cavity 49'. Each tunnel dielectric 56 can have the same composition as the tunnel dielectric 56 illustrated in FIG. 2H. The first semiconductor channel portions 601 can include a doped semiconductor material or an undoped semiconductor material. For example, each first semiconductor channel portions 601 can be a doped polysilicon portion or an undoped polysilicon portion. An anisotropic etch can be performed. A top surface of the substrate semiconductor layer 10 can be physically exposed at the bottom of each memory opening 49 after the anisotropic etch. In one embodiment, the charge storage regions 54 can be a plurality of floating gates. In this case, the tunnel dielectric 56 can be formed in the memory opening over the plurality of floating gates.

Referring to FIGS. 21A-21C, a second semiconductor channel layer 602L can be deposited on the physically exposed top surfaces of the substrate semiconductor layer 10 and sidewalls of the first semiconductor channel portions 601 and over the topmost insulator layer 32. The second semiconductor channel layer 602L can be a doped semiconductor material layer or an undoped semiconductor material layer. For example, the second semiconductor channel layer 602L can be a doped polysilicon layer or an undoped polysilicon layer. In one embodiment, the second semiconductor channel layer 602L does not completely fill the cavity in each memory opening. In another embodiment, the second semiconductor channel layer 602L completely fills the cavities in the memory openings.

Referring to FIGS. 22A-22C, the processing steps of FIGS. 11A and 11B can be performed. Each tunnel dielectric 56, each first semiconductor channel portion 601, and each vertical portion of the second semiconductor channel layer 602L within a memory opening is physically divided into two laterally separated stacks. Each of the laterally separated stacks include a blocking dielectric 52, a charge storage region 54, a tunnel dielectric 56, a first semiconductor channel portion 601, and a vertical portion of the second semiconductor channel layer 602L. The lateral separation distance between the disjoined pair of stacks of a blocking dielectric 52, a charge storage region 54, a tunnel dielectric 56, a first semiconductor channel portion 601, and a vertical portion of the second semiconductor channel layer 602L can be the same as the width of the separation opening therebetween. Each separation opening can extend at least from the top surface of the topmost insulator layer 32 to the top surface of the substrate semiconductor layer 10. Subsequently, the photoresist layer can be removed, for example, by ashing.

Subsequently, the processing steps of FIGS. 12A and 12B can be performed. A dielectric core 162 can be formed within each core cavity employing the same methods as in the second embodiment. Each remaining portion of the second semiconductor channel layer 602L constitutes a second semiconductor channel portion 602. Each adjoining pair of a first semiconductor channel portion 601 and a second semiconductor channel portion 602 can be a portion of a semiconductor channel 60, which may optionally further include a horizontal top portion of the substrate semiconductor layer 10. Each remaining portion of the dielectric material inside a memory opening constitutes a dielectric core 162. A combination of a portion of the dielectric core 162 and a pair of combinations of a memory film 50 and a semiconductor channel 60 may completely fill the volume of a memory opening. Thus, two memory elements can be formed per memory opening at each level.

Subsequently, the second material of the sacrificial material layers 42 can be removed selective to the first material of the insulator layers 32 to form control gate electrodes 46, and optionally lower select gate electrodes and/or upper select gate electrodes. The processing steps of FIG. 2J of the first embodiment may be employed to form the control gate electrodes 46, and optionally lower select gate electrodes and/or upper select gate electrodes 48.

The separator insulating material of the separator insulator structures 43 electrically insulates each first electrically conductive control gate layer from a respective second electrically conductive control gate layer located in a same device level. Each dielectric core 162 provides electrical isolation between a pair of memory elements located at the same level and in, and around, the same memory opening. A source line 76 (See FIG. 1) can be formed in each back side trench 79 employed to fill the back side recesses formed by removal of the sacrificial material layers 42.

Figure 23:
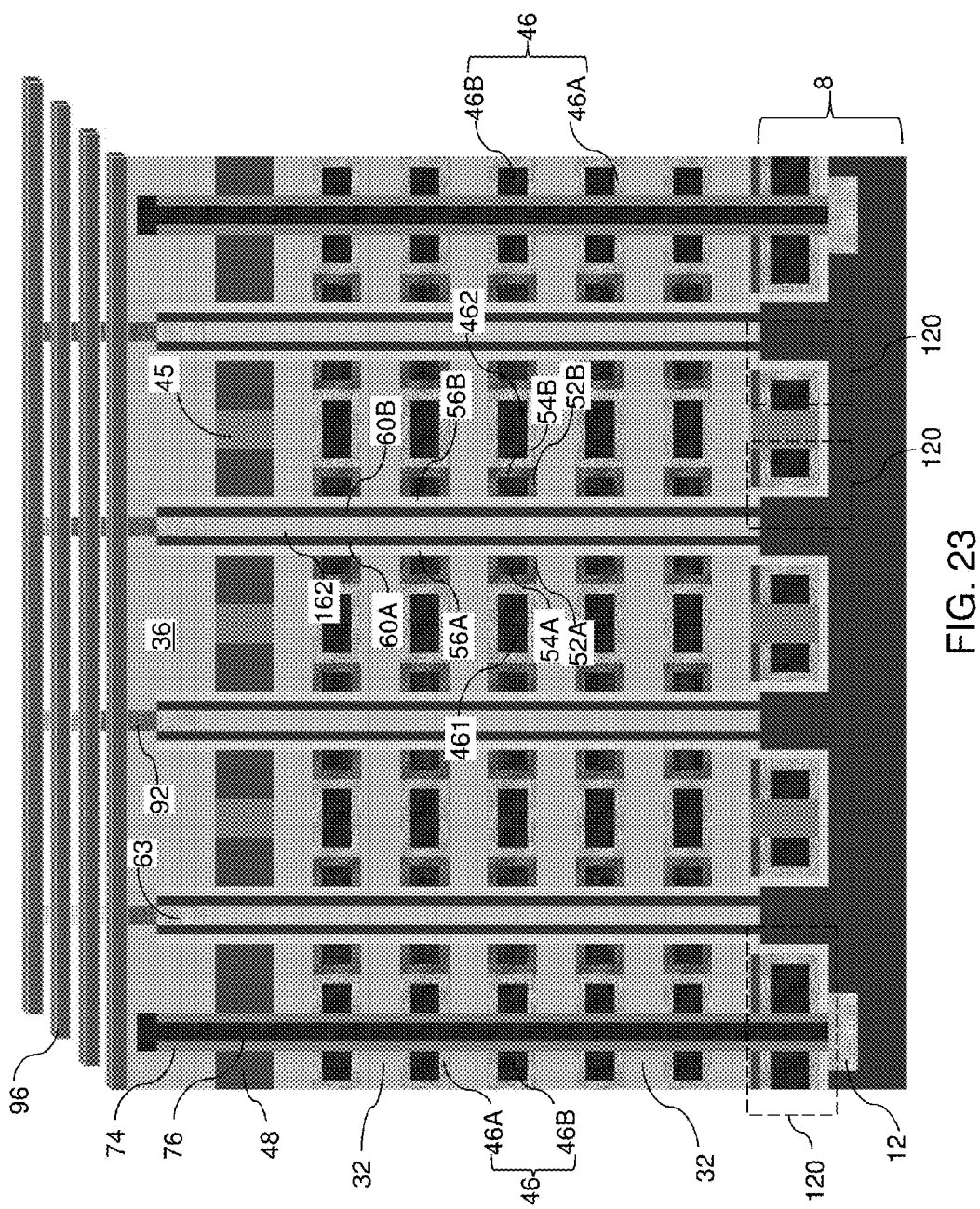
FIG. 23 is a vertical cross-sectional view of the third exemplary device structure after formation of bit lines according to the third embodiment of the present disclosure.

The third exemplary device structure of FIGS. 22A-22C can be incorporated into the exemplary device structure of FIG. 1 or derivatives therefrom. FIG. 23 illustrates the third exemplary device structure upon such incorporation. Each portion of the sacrificial material layers 42 can be replaced with a conductive electrode 46. A drain region 63 can be formed at a top end of each combination of a memory film 50 and a semiconductor channel 60. Contact via structures 92 can be formed on each drain region 63, and bit lines 96 can be formed directly on the contact via structures 92 to access the drain regions 63. A pair of semiconductor channels 60 can be formed in each memory opening over at least a portion of the pair of memory films 50.

Source-side select transistors 120 may be provided in the exemplary device structure. Within each memory opening, a first portion of a memory film 50 located on the first side of the dielectric core 162 is electrically insulated from a second portion of the memory film 50 located on the second side of the dielectric core 162. Within each memory opening, the dielectric core 162 electrically insulates a first portion of the semiconductor channel 60 located on the first side of the dielectric core 162 from a second portion of the semiconductor channel 60 located on the second side of the dielectric core 162.

In one embodiment, a first portion of the memory film 50 can comprises a first blocking dielectric 52A and a first charge storage region 54A which are located in a recess in the first portion of the stack. The first portion of the memory film 50 can further comprise a first tunnel dielectric 56A which together with the first portion 60A of the semiconductor channel 60 comprise a first pillar which extends in the first direction through the insulating material of the insulator layers 32 located in the trench defined by the memory opening. The second portion of the memory film 50 can comprise a second blocking dielectric 52B and a second charge storage region 54B which are located in a recess in the second portion of the stack. The second portion of the memory film 50 further comprises a second tunnel dielectric 56B which together with the second portion 60B of the semiconductor channel 60 comprise a second pillar which extends in the first direction through the insulating material located in the trench. The dielectric core 162 is located between the first pillar and the second pillar, and the dielectric core 162 electrically insulates and physically separates the first pillar from the second pillar. Further, the dielectric core 162 is located between the first charge storage region 54A and the second charge storage region 54B, and the dielectric core 162 electrically insulates and physically separates the first charge storage region 54A from the second charge storage region 54B. The first blocking dielectric 52A contacts the first control gate electrode 461, and the second blocking dielectric 52B contacts the second control gate electrode 462.

In one embodiment, each of the first charge storage region 54A and the second charge storage region 54B can be a floating gate dielectric. In another embodiment, each of the first charge storage region 54A and the second charge storage region 54B can be a charge trapping dielectric.

In one embodiment, the dielectric core 162 comprises a pillar having a cylindrical central portion and wing portions extending in the second direction from the central portion as illustrated in FIGS. 22A and 22C. The cylindrical central portion may have a circular, elliptical, polygonal, or rounded polygonal horizontal cross-sectional shape. The first pillar and the second pillar can extend partially coaxially around the central portion of the dielectric core 162 such that the first pillar is separated from the second pillar by the wing portions of the dielectric core 162.

Figure 24:
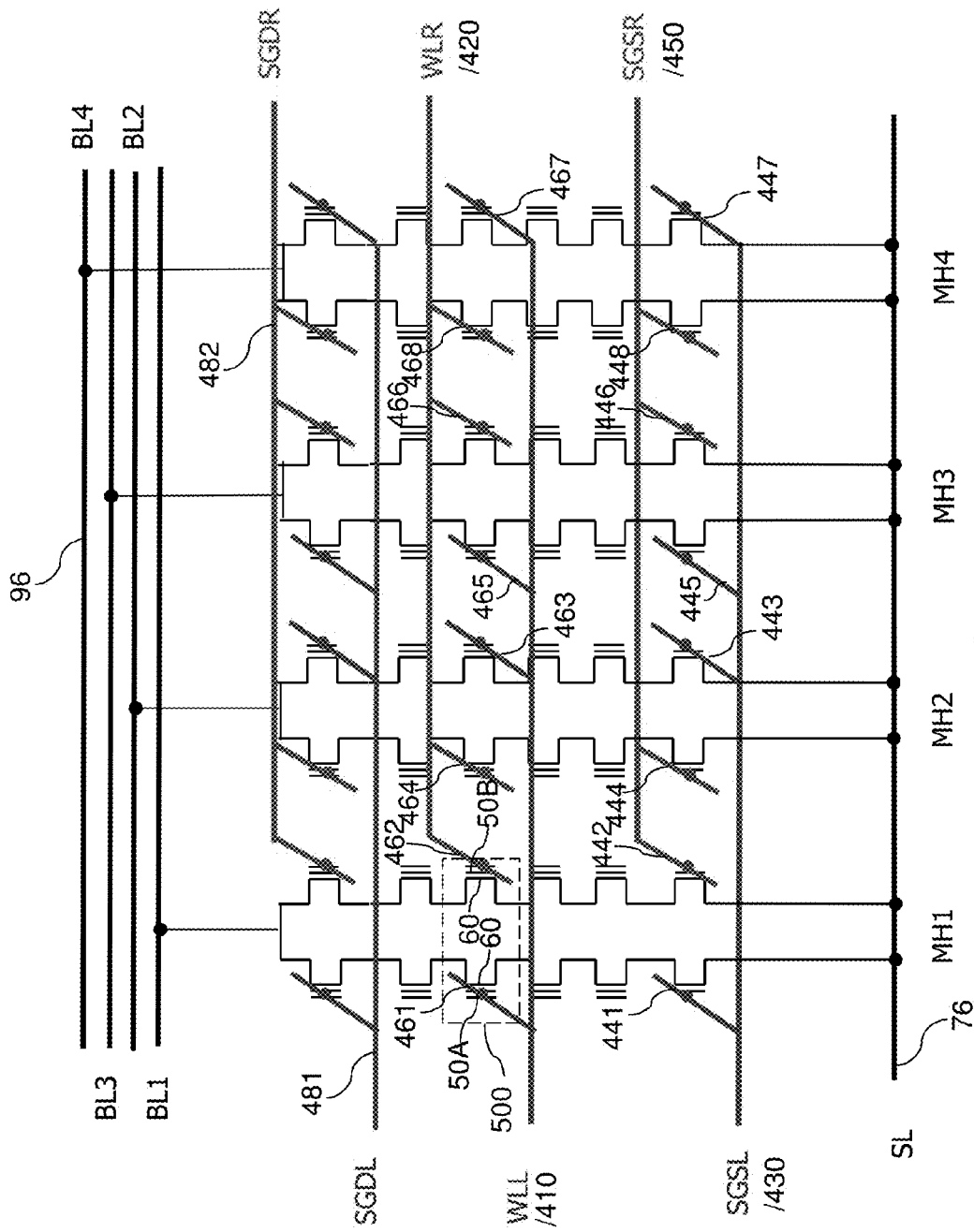
FIG. 24 is a circuit schematic for the array region of the second or third exemplary device structure.

Referring to FIG. 24, a circuit schematic is shown, which can be a circuit schematic of the array region of the second or third exemplary device structure. The circuit schematic represents a plurality of NAND strings. Each NAND string comprises a plurality of memory cells. Each memory cell in the NAND string comprises a portion of a first control gate electrode 461 (See FIG. 23) located adjacent to a first portion 50A of a memory film 50 and a portion of a second control gate electrode 462 which is located adjacent to a second portion 50B of the memory film 50. The second control gate electrode 462 is electrically insulated from the first control gate electrode 461.

Referring to FIGS. 23 and 24 collectively, each memory cell of the NAND memory device can be read by applying a select read voltage of a first polarity type to the first control gate electrode 461, and by applying an unselect read voltage of a second polarity type opposite to the first polarity type to the second control gate electrode 462 during the step of applying the select read voltage to the first control gate electrode 461. For example, the select read voltage can comprise a positive voltage used to read a programmed first portion of the memory cell containing the first portion 50A of the memory film 50, and the unselect read voltage comprises a negative voltage which inhibits a read current from flowing through the second portion of the memory film located in an erased second portion 50B of the memory cell 50.

The NAND memory device can comprise a substrate 8 having a major surface 9. The first plurality of memory cells are arranged in the first NAND string extending in a first direction substantially perpendicular to the major surface 9 of the substrate 8 in a plurality of device levels. Each of the first plurality of memory cells is positioned in a respective one of the plurality of device levels above the substrate 8. A first select gate electrode, e.g., a lower select gate electrode 44, is located between the major surface 9 of the substrate 8 and the first plurality of memory cells, and a second select gate electrode, e.g., an upper select gate electrode 48, is located above the first plurality of memory cells. The first control gate electrode extends in a second direction substantially parallel to the major surface 9, and the second control gate electrode extends in the second direction and spaced apart from the respective first control gate electrode in a third direction substantially parallel to the major surface 9 and transverse to the second direction. Each memory cell can comprise a first portion 50A of a memory film 50 which is located between the first control gate electrode 461 and a first portion of a semiconductor channel 60, and a second portion 50B of the memory film 50 which is located between the second control gate electrode and a second portion of the semiconductor channel 60. The first portion 50A of the memory film 50 is electrically isolated from the second portion 50B of the memory film 50. The core dielectric 162 electrically isolates the first portion of the semiconductor channel 60 from the second portion of the semiconductor channel 60. A first word line can comprise a comb shaped word line WLL/410 having a terrace contact portion (not shown) located in the first stepped contact region (not shown) and a plurality of prongs (461, 463, 465, 467) extending from a terrace contact portion into the device region. The second word line can comprise a comb shaped word line WLR/420 having a terrace contact portion (not shown) located in the second stepped contact region (not shown) and a plurality of prongs (462, 464, 466, 468) extending from the terrace contact portion into the device region.

In a non-limiting illustrative example, a read operation of on a memory cell in a memory opening (e.g., MH1, MH2, MH3, MH4) can be performed by applying a voltage of about 6.8 V to a selected upper select gate electrode (e.g., SGDL/481), a voltage of about 0 V to an unselected upper select gate electrode (e.g., SGDR/482), a selected-line read voltage of about 0 V to a selected word line (e.g., WLL/410) connected to the selected control gate electrode (e.g., a first control gate electrode 461), and an unselected-line read voltage of about 8 V to unselected word lines (e.g., WLR/420) connected to unselected control gate electrodes (including a second control gate electrode 462). A voltage of about 6.8 V can be applied to the selected lower select gate electrode (e.g., SGSL/430), and a voltage of about 0 V can be applied to the unselected lower select gate electrode (e.g., SGSR/450) connected to the same memory stack structure 55 (See FIG. 1). A voltage of about 1.3 V can be applied to the selected bit line (e.g., BL1), and a voltage of about 0 V can be applied to the unselected bit lines (e.g., BL2, BL3, BL4). The source line SL/76 can be biased at about 0.8 V. The various voltages can be scaled and/or adjusted as needed.

In a non-limiting illustrative example, a programming operation of on a memory cell can be performed by applying a voltage of about 2.5 V to a selected upper select gate electrode (e.g., SGDL/481), a voltage of about 0 V to an selected upper select gate electrode (e.g., SGDR/482), a selected-line programming voltage of about 20 V to a selected word line (e.g., WLL/410) connected to the selected control gate electrode (e.g., a first control gate electrode 461), and an unselected programming voltage of about 8.5 V to unselected word lines (e.g., WLR/420) connected to unselected control gate electrodes. A voltage of about 0 V can be applied to the selected lower select gate electrode (e.g., SGSL/430), and a voltage of about 2.5 V can be applied to unselected lower select gate electrodes SGSR/450. A voltage of about 0 V can be applied to the selected bit line (e.g., BL1), and a voltage of about 2.5 V can be applied to the unselected bit lines (e.g., BL2, BL3, BL4). The source line SL can be biased at about 2.5 V.

In a non-limiting illustrative example, an erase operation of on a memory cell can be performed by applying about 0 V to the selected word line (e.g., WLL/410), about 23 V to the substrate semiconductor layer 10, and 0V volt to all bit lines (BL1, BL2, BL3, BL4)/96. The various unselected word lines and the source line SL/76 can be electrically floating.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of making a memory device, the method comprising:
    forming a stack of alternating layers of a first material and a second material different from the first material over a substrate;
    forming a trench through the stack;
    filling the trench with a separator insulating material;
    forming a memory opening in the stack extending through the separator insulating material located in the trench by etching a portion of the separator insulating material, wherein remaining portions of the separator insulating material include two physically disjoined portions of the separator insulating material that are laterally spaced from each other by a cavity that defines a volume of the memory opening;
    forming at least a portion of a memory film within a volume of the memory opening after formation of the memory opening; and
    forming a semiconductor channel within the volume of the memory opening over the at least the portion of the memory film.

2. The method of claim 1, further comprising forming a dielectric core over the semiconductor channel in the memory opening.

3. The method of claim 1, wherein:
    layers within the stack of alternating layers that include the first material comprise insulator layers; and
    layers within the stack of alternating layers that include the second material comprise sacrificial layers.

4. The method of claim 3, further comprising:
    forming a first back side trench on a first side of the separator insulating material;
    forming a second back side trench on a second side of the separator insulating material;
    removing the sacrificial layers through the first and the second back side trenches to form respective first and second back side recesses;
    forming first electrically conductive control gate layers in the first back side recesses through the first back side trench; and
    forming second electrically conductive control gate layers in the second back side recesses through the second back side trench, wherein the separator insulating material electrically insulates each first electrically conductive control gate layer from a respective second electrically conductive control gate layer located in a same device level.

5. The method of claim 4, further comprising:
    forming a first lower select gate layer in a bottommost first back side recess through the first back side trench; and
    forming a second lower select gate layer in bottommost second back side recesses through the second back side trench, wherein the separator insulating material electrically insulates the first lower select gate layer from the second lower select gate layer.

6. The method of claim 5, further comprising:
    forming an insulating cover layer and a select gate sacrificial layer over the separating insulator layer prior to the step of forming the memory opening and the first and the second back side trenches such that the memory opening, and the first back side trench and the second back side trench extend through the insulating cover layer and through the select gate sacrificial layer;
    removing the sacrificial select gate layer through the first and the second back side trenches to form select gate back side recess;
    forming an upper select gate layer in the select gate back side recess through the first and the second back side trenches such that the upper select gate layer surrounds the at least a portion of the memory film located in the memory opening.

7. The method of claim 4, further comprising forming a first source line in the first back side trench.

8. The method of claim 1, wherein forming at least a portion of a memory film in the memory opening comprises forming a blocking dielectric layer in the memory opening, forming at least one charge storage region in the memory opening, and forming a tunnel dielectric in the memory opening.

9. The method of claim 7, wherein the at least one charge storage region comprises a charge trapping dielectric layer.

10. The method of claim 9, further comprising:
    forming a separation opening through the semiconductor channel and the memory film to separate the semiconductor channel and the memory film into a first portion and a second portion along a direction parallel to the separating insulating material; and
    filling the separation opening with a dielectric core.

11. The method of claim 1, wherein forming at least a portion of a memory film in the memory opening comprises:
 forming front side recesses in the sacrificial material layers through the memory opening;
 forming a blocking dielectric and a plurality of floating gates in the front side recesses through the memory opening; and
 forming a tunnel dielectric in the memory opening over the plurality of floating gates.

12. The method of claim 11, further comprising:
 forming a separation opening through the semiconductor channel and the tunnel dielectric to separate the semiconductor channel and the tunnel dielectric into a first portion and a second portion along a direction parallel to the separating insulating material; and
 filling the separation opening with a dielectric core.

13. The method of claim 1, further comprising forming a memory stack structure in the memory opening, wherein the memory stack structure comprises the memory film and the semiconductor channel.

14. The method of claim 1, wherein the trench extends along a lengthwise direction and has a width along widthwise direction that is perpendicular to the lengthwise direction, wherein the width of the trench is less than a dimension of the trench along the lengthwise direction.

15. The method of claim 1, wherein the memory opening has a greater lateral dimension along the widthwise direction than the width of the trench.

16. The method of claim 1, further comprising forming a dielectric core within a volume inside the semiconductor channel, wherein the dielectric core has a same volume as the volume inside the semiconductor channel upon formation.

17. The method of claim 1, further comprising:
 removing vertical portions of the memory film and the semiconductor channel by an anisotropic etch to laterally expand a cavity within the semiconductor channel; and
 forming a dielectric core within the cavity, wherein the dielectric core physically contacts sidewalls of the memory film.

18. The method of claim 17, wherein the semiconductor channel includes a horizontal portion underlying the dielectric core and two vertical portions that are laterally spaced from each other by the dielectric core.

19. The method of claim 17, wherein:
 the two physically disjoined portions of the separator insulating material extend further along a lengthwise direction than along a widthwise direction; and
 the dielectric core has a greater dimension along the lengthwise direction of the two physically disjoined portions of the separator insulating material than along the widthwise direction of the two physically disjoined portions of the separator insulating material.

20. The method of claim 1, wherein the trench has an undulating width or a substantially uniform width.

21. The method of claim 1, further comprising laterally expanding the memory opening at levels of the second material to form front side recesses by etching the second material selective to the first material and the separator insulating material.

22. The method of claim 21, wherein recessed sidewalls of the second material adjoin lengthwise sidewalls of the physically disjoined portions of the separator insulating material.

23. The method of claim 21, further comprising forming discrete blocking dielectrics in the front side recesses, wherein one discrete blocking dielectric is formed per front side recess.

24. The method of claim 23, wherein a pair of discrete blocking dielectrics are formed per each level of second material within the memory opening after formation of the front side recesses.

25. The method of claim 23, wherein the discrete blocking dielectrics are formed by:
 depositing a continuous blocking dielectric layer within the front side recesses; and
 removing vertical portions of the blocking dielectric layer that do not underlie portions of the first material from within the memory opening.

26. The method of claim 1, wherein an entire volume of the trench is filled with the separator insulating material prior to formation of the memory opening.

27. The method of claim 1, wherein the cavity formed by etching the portion of the separator insulating material has a same volume as an entire volume of the memory opening.

28. The method of claim 1, wherein the cavity formed by etching the portion of the separator insulating material is subsequently expanded at levels of the second material within the stack of alternating layers to expand a volume of the memory opening prior to formation of the memory film.

* * * * *